United States Patent
Lee

(10) Patent No.: US 12,009,821 B2
(45) Date of Patent: Jun. 11, 2024

(54) OUTPUT DRIVER AND OUTPUT BUFFER CIRCUIT INCLUDING THE SAME

(71) Applicant: SAMSUNG ELECTRONICS CO., LTD., Suwon-si (KR)

(72) Inventor: Kyungsoo Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 19 days.

(21) Appl. No.: 17/889,543

(22) Filed: Aug. 17, 2022

(65) Prior Publication Data
US 2023/0155574 A1   May 18, 2023

(30) Foreign Application Priority Data

Nov. 16, 2021 (KR) .................. 10-2021-0157497
Jan. 28, 2022 (KR) .................. 10-2022-0012904

(51) Int. Cl.
*H03K 3/011* (2006.01)
*H03K 3/012* (2006.01)
*H03K 17/687* (2006.01)

(52) U.S. Cl.
CPC ............ *H03K 3/011* (2013.01); *H03K 3/012* (2013.01); *H03K 17/6872* (2013.01); *H03K 17/6874* (2013.01)

(58) Field of Classification Search
CPC .... H03K 3/011; H03K 3/012; H03K 17/6872; H03K 17/6874; H03K 19/00315; H03K 19/018521
See application file for complete search history.

(56) References Cited

U.S. PATENT DOCUMENTS

| 5,969,542 | A | 10/1999 | Maley et al. |
| 6,130,563 | A * | 10/2000 | Pilling ................ H03K 17/164 327/437 |
| 6,580,285 | B2 | 6/2003 | Kato et al. |
| 6,777,985 | B2 | 8/2004 | Moon et al. |
| 6,859,074 | B2 | 2/2005 | Ajit |
| 8,154,323 | B2 | 4/2012 | Kim et al. |

(Continued)

FOREIGN PATENT DOCUMENTS

| JP | 5644088 B2 | 12/2014 |
| KR | 10-1652824 B1 | 8/2016 |
| KR | 10-1989571 B1 | 6/2019 |

*Primary Examiner* — Ryan Johnson
*Assistant Examiner* — Colleen J O Toole
(74) *Attorney, Agent, or Firm* — Sughrue Mion, PLLC

(57) ABSTRACT

An output driver is provided. The output driver includes: a pull-up driver connected between an output power supply voltage and an output node, and configured to pull up a voltage at the output node based on a pull-up driving signal and a pull-up reference voltage; a pull-down driver connected between the output node and a ground voltage, and configured to pull down the voltage at the output node based on a pull-down driving signal and a pull-down reference voltage; and a reference voltage compensation circuit configured to perform a short operation during transitions of the pull-up driving signal and the pull-down driving signal, wherein the short operation includes electrically connecting any one or any combination of the pull-up reference voltage to the ground voltage, and the pull-down reference voltage to the output power supply voltage.

20 Claims, 18 Drawing Sheets

(56) References Cited

U.S. PATENT DOCUMENTS

| | | | |
|---|---|---|---|
| 8,994,412 B2 * | 3/2015 | Kim | H03K 3/356165 |
| | | | 327/109 |
| 9,118,315 B2 | 8/2015 | P et al. | |
| 9,419,613 B2 | 8/2016 | P et al. | |
| 10,454,466 B1 * | 10/2019 | Tiwari | H03K 17/0822 |
| 10,903,840 B2 | 1/2021 | Chen | |
| 2009/0167368 A1 | 7/2009 | Chan et al. | |
| 2012/0200159 A1 | 8/2012 | Katagiri et al. | |

* cited by examiner

100

US 12,009,821 B2

OUTPUT DRIVER AND OUTPUT BUFFER CIRCUIT INCLUDING THE SAME

CROSS-REFERENCE TO RELATED APPLICATION

This application claims priority under 35 U.S.C. § 119 to Korean Patent Application No. 10-2021-0157497, filed on Nov. 16, 2021 and Korean Patent Application No. 10-2022-0012904, filed on Jan. 28, 2022, in the Korean Intellectual Property Office, the disclosures of which are incorporated by reference herein in their entireties.

BACKGROUND

1. Field

Example embodiments relate generally to semiconductor integrated circuits, and more particularly, to an output driver and an output buffer circuit including an output driver.

2. Description of Related Art

A high speed interface requiring a low power supply voltage and a high speed operation may be used in a semiconductor chip. An operation circuit in a semiconductor chip may use complementary metal oxide semiconductor (CMOS) transistors having a medium gate oxide film for an operation of a low voltage (e.g., 1.8V) is used more often than CMOS transistors having a thick gate oxide film for a high voltage (e.g., 3.3V).

An input-output circuit manufactured by CMOSFETs having a medium gate oxide film for an operation of the low voltage may be destroyed by application of the high voltage. There is a need for an input-output circuit that includes the medium gate oxide film transistors for the operation of the low voltage to support an interface voltage of the high voltage without destroying the input-output circuit.

A general purpose input-output (GPIO) circuit for the high voltage made using low voltage transistors may face at least one problem of reliability degradation of the transistor device due to overvoltage, an increase of static power consumption, degradation of an operation speed and a restriction of a wide range performance. Thus, it is difficult that the GPIO circuit reliably and rapidly supports fields of a mobile device or a high speed application.

SUMMARY

One or more example embodiments provide an output driver, an output buffer circuit and a semiconductor device including the output driver, capable of improving a slew rate of an output signal.

One or more example embodiments provide a method of compensating for a reference voltage, capable of improving a slew rate of an output signal.

According to example embodiments, an output driver includes: a pull-up driver connected between an output power supply voltage and an output node, and configured to pull up a voltage at the output node based on a pull-up driving signal and a pull-up reference voltage; a pull-down driver connected between the output node and a ground voltage, and configured to pull down the voltage at the output node based on a pull-down driving signal and a pull-down reference voltage; and a reference voltage compensation circuit configured to perform a short operation during transitions of the pull-up driving signal and the pull-down driving signal. The short operation includes electrically connecting any one or any combination of the pull-up reference voltage to the ground voltage, and the pull-down reference voltage to the output power supply voltage.

According to example embodiments, an output buffer circuit includes: a level shifting circuit configured to generate a pull-up driving signal and a pull-down driving signal based on an input signal; and an output driver configured to generate an output signal at an output node based on the pull-up driving signal and the pull-down driving signal. The output driver includes: a pull-up driver connected between an output power supply voltage and the output node, and configured to pull up a voltage at the output node based on the pull-up driving signal and a pull-up reference voltage; a pull-down driver connected between the output node and a ground voltage, and configured to pull down the voltage at the output node based on the pull-down driving signal and a pull-down reference voltage; and a reference voltage compensation circuit configured to perform a short operation during transitions of the pull-up driving signal and the pull-down driving signal. The short operation includes electrically connecting any one or any combination of the pull-up reference voltage to the ground voltage and the pull-down reference voltage to the output power supply voltage.

According to example embodiments, an output driver includes: a pull-up driving transistor and a pull-up bias transistor connected by a cascode structure between an output power supply voltage and an output node, wherein a gate electrode of the pull-up driving transistor is configured to receive a pull-up driving signal, and a gate electrode of the pull-up bias transistor is configured to receive a pull-up reference voltage; a pull-down driving transistor and a pull-down bias transistor connected by a cascode structure between the output node and a ground voltage, wherein a gate electrode of the pull-down driving transistor is configured to receive a pull-down driving signal, and a gate electrode of the pull-down bias transistor is configured to receive a pull-down reference voltage; a first reference voltage compensation circuit configured to electrically connect the pull-up reference voltage to the ground voltage during transitions of the pull-down driving signal; and a second reference voltage compensation circuit configured to electrically connect the pull-down reference voltage to the output power supply voltage during transitions of the pull-up driving signal.

The output driver and the output buffer circuit according to example embodiments may realize high voltage input-output without high voltage components.

In addition, the output driver and the output buffer circuit according to example embodiments may stabilize the reference voltage and improve a slew rate or a transition delay of the output signal by compensating for fluctuation of the reference voltage through the short operation.

BRIEF DESCRIPTION OF THE DRAWINGS

The above and other aspects and features will be more apparent from the following description of example embodiments with reference to the accompanying drawings, in which.

DETAILED DESCRIPTION

Figure 1:
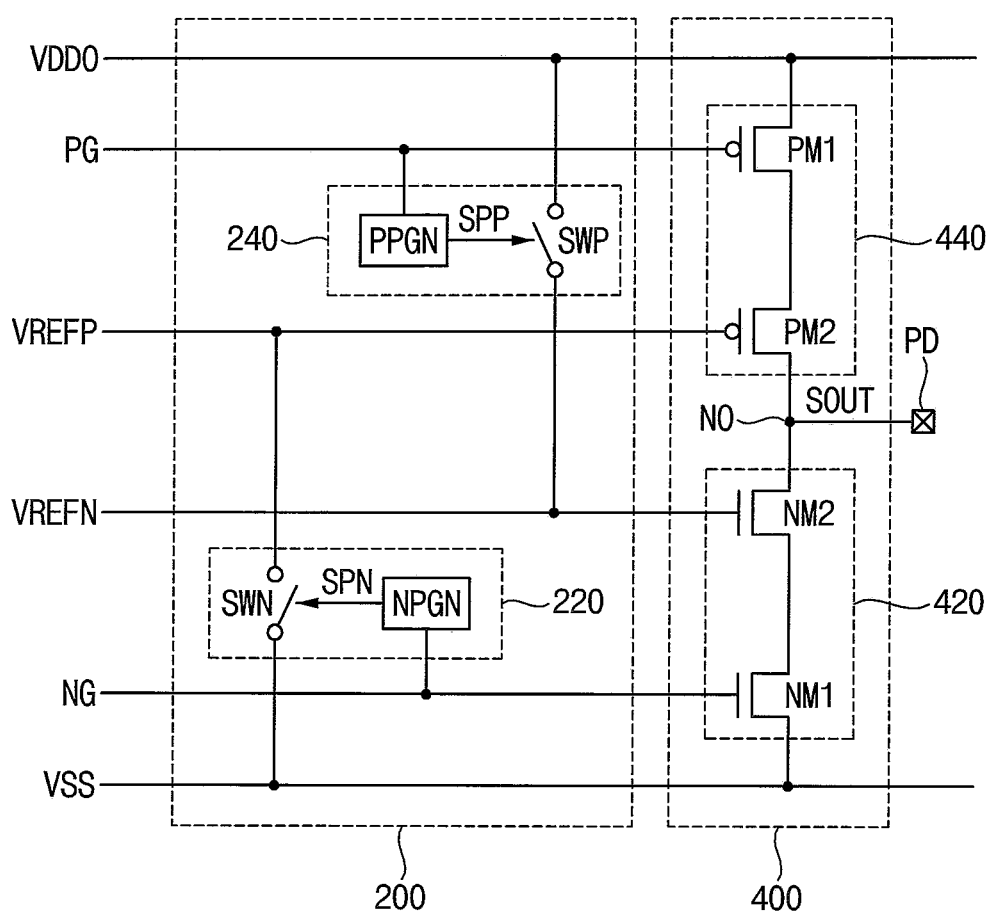
FIG. 1 is a diagram illustrating an output driver according to example embodiments.

Example embodiments will be described more fully hereinafter with reference to the accompanying drawings. In the drawings, like numerals refer to like elements throughout. Repeated descriptions may be omitted.

FIG. 1 is a diagram illustrating an output driver according to example embodiments.

Referring to FIG. 1, an output driver 10 includes a reference voltage compensation circuit 200 and a driving circuit 400.

The driving circuit 400 may include a pull-down driver 420 and a pull-up driver 440. The pull-up driver 440 may be connected between an output power supply voltage VDDO and an output node NO generating an output signal SOUT. The pull-up driver 440 may pull up a voltage at the output node NO based on a pull-up driving signal PG and a pull-up reference voltage VREFP. The pull-down driver 420 may be connected between the output node NO and a ground voltage VSS. The pull-down driver 420 may pull down the voltage at the output node NO based on a pull-down driving signal NG and a pull-down reference voltage VREFN.

The output signal SOUT may be provided to an external device through a pad PD connected to the output node NO.

The reference voltage compensation circuit 200 may perform a short operation during transitions of the pull-up driving signal PG and the pull-down driving signal NG. For example, the reference voltage compensation circuit 200 may electrically connect at least one of the pull-up reference voltage VREFP and the pull-down reference voltage VREFN to at least one of the output power supply voltage VDDO and the ground voltage VSS.

The reference voltage compensation circuit 200 may include at least one of a first reference voltage compensation circuit 220 and a second reference voltage compensation circuit 240. The first reference voltage compensation circuit 220 may perform a pull-down short operation during transitions of the pull-down driving signal NG such that the pull-up reference voltage VREFP is electrically connected to the ground voltage VSS. The second reference voltage compensation circuit 240 may perform a pull-up short operation during transitions of the pull-up driving signal PG such that the pull-down reference voltage VREFN is electrically connected to the output power supply voltage VDDO.

To perform such short operations, the first reference voltage compensation circuit 220 may include a pull-down pulse generation circuit NPGN and a pull-down switch circuit SWN, and the second reference voltage compensation circuit 240 may include a pull-up pulse generation circuit PPGN and a pull-up switch circuit SWP.

In some example embodiments, as will be described below with reference to FIGS. 2 and 3, the pull-down pulse generation circuit NPGN may generate a pull-down pulse signal SPN that is activated at falling edges of the pull-down pulse signal. The pull-down switch circuit SWN may electrically connect the pull-up reference voltage VREFP and the ground voltage VSS based on activation of the pull-down pulse signal SPN.

In some example embodiments, as will be described below with reference to FIGS. 5 and 6, the pull-up pulse generation circuit PPGN may generate a pull-up pulse signal SPP that is activated at rising edges of the pull-up driving signal PG. The pull-up switch circuit SWP may electrically connect the pull-down reference voltage VREFN and the output power supply voltage VDDO based on activation of the pull-up pulse signal SPP.

As such, the reference voltage compensation circuit 200 may include a pulse generation circuit PPGN and/or NPGN configured to generate a pulse signal SPP and/or SPN that is activated in synchronization with edges of the pull-up driving signal PG and/or NG, and a switch circuit SWP and/or SWN configured to perform the short operation based on activation of the pulse signal SPP and/or SPN.

In some example embodiments, the reference voltage compensation circuit 200 may include only the first reference voltage compensation circuit 220. In this case, the reference voltage compensation circuit 200 may perform only the pull-down short operation to electrically connecting the pull-up reference voltage VREFP and the ground voltage VSS.

In some example embodiments, the reference voltage compensation circuit 200 may include only the second reference voltage compensation circuit 240. In this case, the reference voltage compensation circuit 200 may perform only the pull-up short operation to electrically connecting the pull-down reference voltage VREFN and the output power supply voltage VDDO.

In some example embodiments, the reference voltage compensation circuit 200 may include both of the first reference voltage compensation circuit 220 and the second reference voltage compensation circuit 240. In this case, the reference voltage compensation circuit 200 may perform both of the pull-down short operation and the pull-up short operation.

The pull-up driver 440 may include a pull-up driving transistor PM1 and a pull-up bias transistor PM2 connected by a cascode structure between the output power supply voltage VDDO and the output node NO. The pull-up driving signal PG may be applied to a gate electrode of the pull-up driving transistor PM1, and the pull-up reference voltage VREFP may be applied to a gate electrode of the pull-up bias transistor PM2. The pull-up driving transistor PM1 and the pull-up bias transistor PM2 may be PMOS (P-type metal oxide semiconductor) transistors.

The pull-down driver 420 may include a pull-down driving transistor NM1 and a pull-down bias transistor NM2 connected by a cascode structure between the output node NO and the ground voltage VSS. The pull-down driving signal NG may be applied to a gate electrode of the pull-down driving transistor NM1, and the pull-down reference voltage VREFN may be applied to a gate electrode of the pull-down bias transistor NM2. The pull-down driving transistor NM1 and the pull-down bias transistor NM2 may be NMOS (N-type metal oxide semiconductor) transistors.

FIG. 1 illustrates an example embodiment of the driving circuit 400 having two-stage stack structure, but example embodiments are not limited thereto. For example, as will be described below with reference to FIG. 16, the driving circuit may have a three-stage stack structure and so on.

The output driver 10 of FIG. 1 may be a high-speed high-voltage circuit having a wide range output such that the output signal SOUT may transition or toggle between the ground voltage VSS and the output power supply voltage VDDO corresponding to a high voltage, even though the output driver 10 includes low voltage components. For example, the output power supply voltage VDDO may be about 3.3V, the pull-up reference voltage VREFP may be about 1.5V, the pull-down reference voltage VREFN may be about 1.8V and the ground voltage VSS may be about 0V. In this case, damage to the devices (e.g., transistors) by the 3.3V operation may be reduced or prevented even though the output driver 10 is manufactured using components configured to withstand a voltage of about 1.8V.

As such, the output driver 10 according to example embodiments may realize high-voltage input-output without high-voltage components. In addition, the output driver 10 may stabilize the reference voltages VREFP and VREFN and improve a slew rate or a transition delay of the output signal SOUT by compensating for fluctuation of the reference voltages VREFP and VREFN through the short operations.

Figure 2:
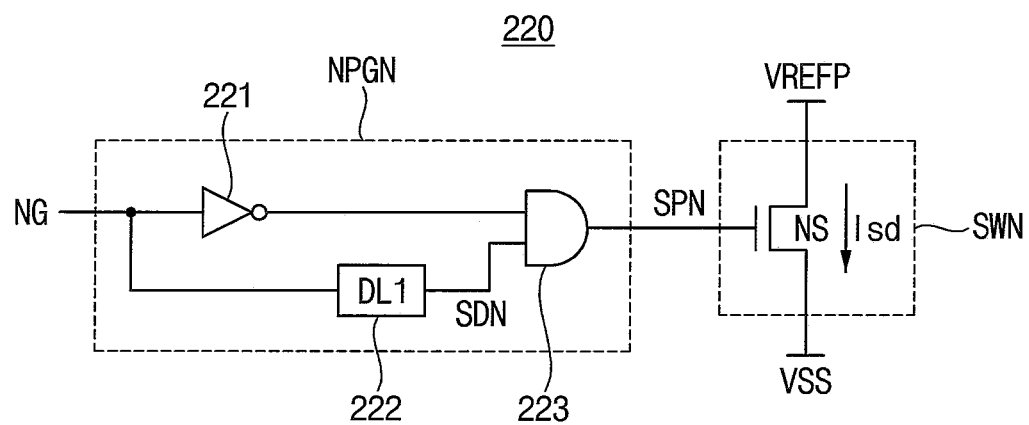
FIG. 2 is a circuit diagram illustrating a reference voltage compensation circuit included in an output driver according to example embodiments.
Figure 3:
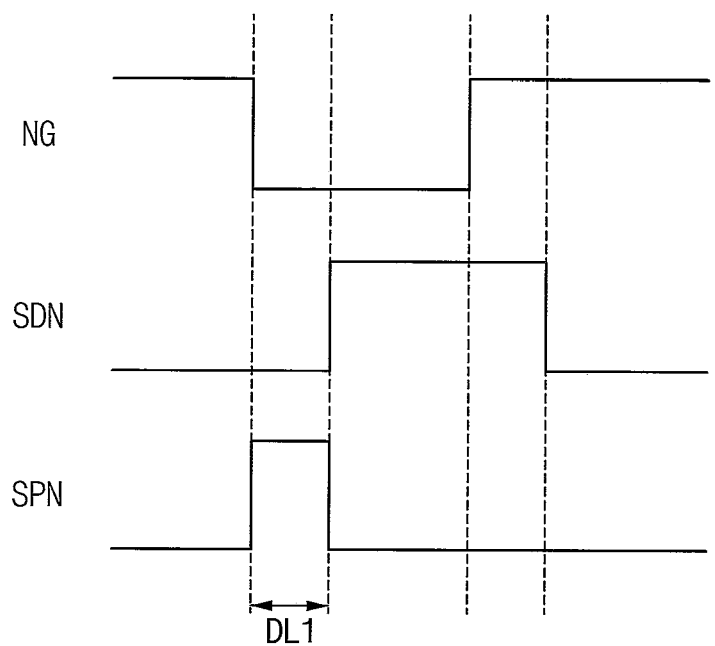
FIG. 3 is a timing diagram illustrating an operation of the reference voltage compensation circuit of FIG. 2.

FIG. 2 is a circuit diagram illustrating a reference voltage compensation circuit included in an output driver according to example embodiments, and FIG. 3 is a timing diagram illustrating an operation of the reference voltage compensation circuit of FIG. 2.

Referring to FIG. 2, a first reference voltage compensation circuit 220 may include a pull-up pulse generation circuit NPGN and a pull-down switch circuit SWN.

The pull-up pulse generation circuit NPGN may include an inverter 221, a delay circuit 222 having a delay time DL1 and an AND gate 223. The pull-down switch circuit SWN may include at least one N-type transistor NS connected between the pull-up reference voltage VREFP and the ground voltage VSS. The N-type transistor NS may be an NMOS transistor.

Referring to FIGS. 2 and 3, the inverter 221 may invert the pull-down driving signal NG and the delay circuit 222 may output a delayed signal SDN by delaying the pull-down driving signal NG by the delay time DL1. The AND gate 223 may generate the pull-down pulse signal SPN by performing an AND logic operation of the output of the inverter 221 and the delayed signal SDN.

As such, the pull-down pulse signal SPN may be activated at falling edges of the pull-down driving signal NG, and the pull-down pulse signal SPN may include pulses having an activated level higher than a deactivated voltage level. The pulse width of the pull-down pulse signal SPN, that is, the delay time DL1 of the delay circuit 222 may be determined according to operational characteristics of the output driver. For example, the pulse width of the pull-down pulse signal SPN may be between several tens of picoseconds and several nanoseconds.

The N-type transistor NS may electrically connect the pull-up reference voltage VREFP and the ground voltage VSS based on activation of the pull-down pulse signal SPN. As such, the first reference voltage compensation circuit 220 may perform the pull-down short operation to electrically connect the pull-up reference voltage VREFP and the ground voltage VSS while the pull-down driving signal NG transitions.

Figure 4:
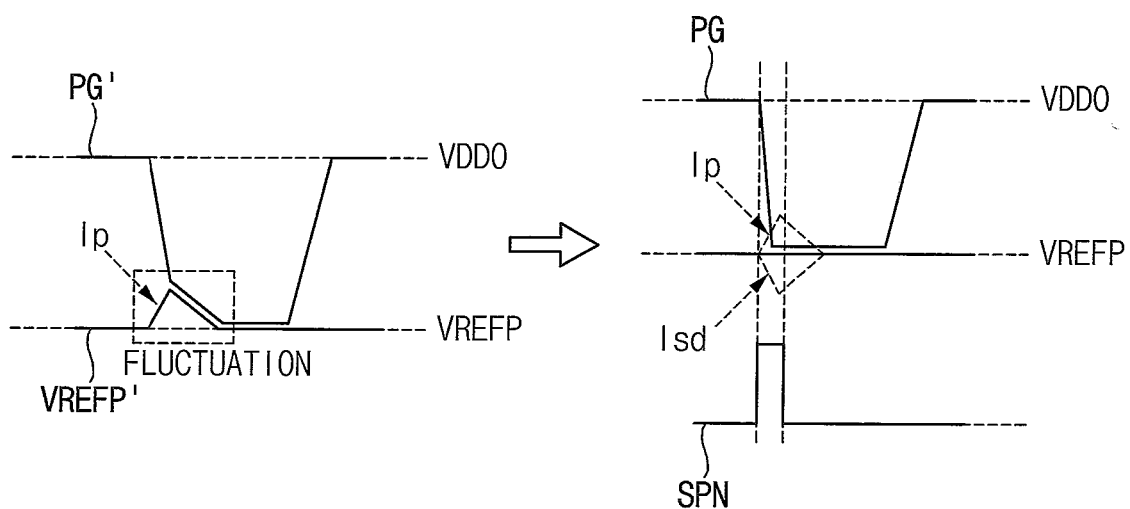
FIG. 4 is a diagram illustrating improvement of a slew rate by the reference voltage compensation circuit of FIG. 2.

FIG. 4 is a diagram illustrating improvement of a slew rate by the reference voltage compensation circuit of FIG. 2.

A pull-up driving signal PG' and a pull-up reference voltage VREFP' when the pull-down short operation according to example embodiments is not performed are illustrated in the left portion of FIG. 4, and a pull-up driving signal PG and a pull-up reference voltage VREFP when the pull-down short operation is performed are illustrated in the right portion of FIG. 4.

When the pull-down short operation is not performed, an operation current Ip flows from the output power supply voltage VDDO to the pull-up reference voltage VREFP, while the pull-up driving signal PG' transitions from the output power supply voltage VDDO to the pull-up reference voltage VREFP, that is, at the falling edge of the pull-up driving signal PG'. Accordingly there is a fluctuation such that the pull-up reference voltage VREFP' increases temporarily, and thus the falling time of the pull-up driving signal PG' increases.

In contrast, when the pull-down short operation according to example embodiments is performed, a pull-down short current Isd flowing from the pull-up reference voltage VREFP to the ground voltage VSS may be induced. Accordingly, the fluctuation in the pull-up reference voltage VREFP may be reduced or prevented, and thus the pull-up driving signal PG may have a reduced falling time or an improved slew rate in comparison with the pull-up driving signal PG'.

Figure 5:
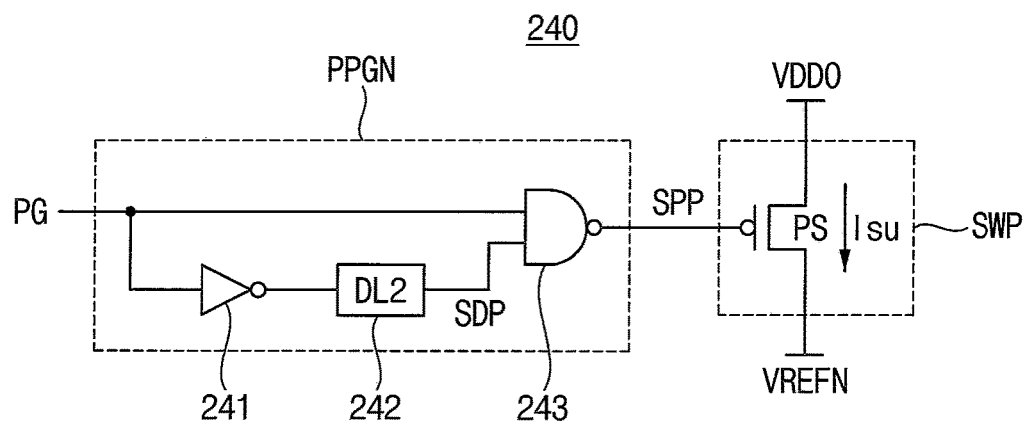
FIG. 5 is a circuit diagram illustrating a reference voltage compensation circuit included in an output driver according to example embodiments.
Figure 6:
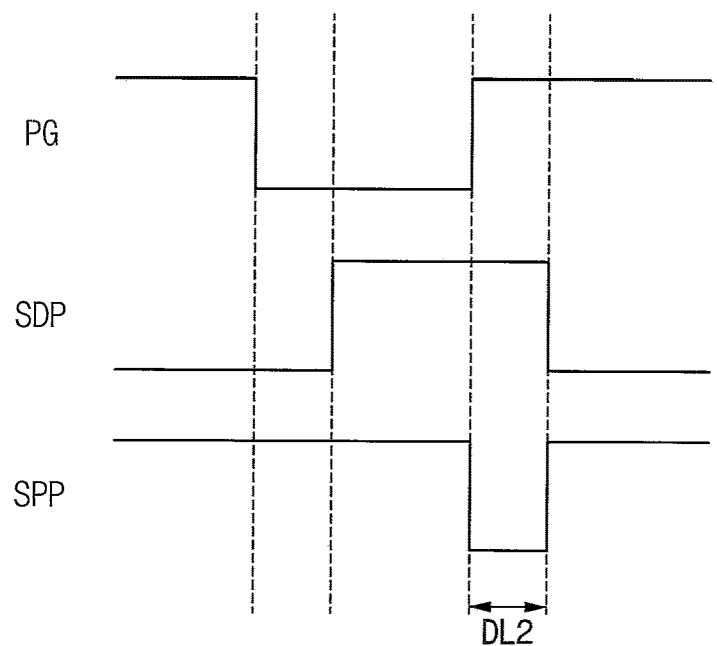
FIG. 6 is a timing diagram illustrating an operation of the reference voltage compensation circuit of FIG. 5.

FIG. 5 is a circuit diagram illustrating a reference voltage compensation circuit included in an output driver according to example embodiments, and FIG. 6 is a timing diagram illustrating an operation of the reference voltage compensation circuit of FIG. 5.

Referring to FIG. 5, a second reference voltage compensation circuit 240 may include a pull-up pulse generation circuit PPGN and a pull-down switch circuit SWP.

The pull-up pulse generation circuit PPGN may include an inverter 241, a delay circuit 242 having a delay time DL2 and an NAND gate 243. The pull-up switch circuit SWP may include at least one P-type transistor PS connected between the output power supply voltage VDDO and the pull-down reference voltage VREFN. The P-type transistor PS may be a PMOS transistor.

Referring to FIGS. 5 and 6, the inverter 241 may invert the pull-up driving signal PG and the delay circuit 242 may output a delayed signal SDP by delaying the pull-up driving signal PG by the delay time DL2. The NAND gate 243 may generate the pull-up pulse signal SPP by performing a NAND logic operation of the output of the inverter 241 and the delayed signal SDP.

As such, the pull-up pulse signal SPP may be activated at rising edges of the pull-up driving signal PG, and the pull-up pulse signal SPP may include pulses having an activated voltage level lower than a deactivated voltage level. The pulse width of the pull-up pulse signal SPP, that is, the delay time DL2 of the delay circuit 242 may be determined according to operational characteristics of the output driver. For example, the pulse width of the pull-up pulse signal SPP may be between several tens of picoseconds and several nanoseconds.

The P-type transistor PS may electrically connect the output power supply voltage VDDO and the pull-down reference voltage VREFN based on activation of the pull-up pulse signal SPP. As such, the second reference voltage compensation circuit 240 may perform the pull-up short operation to electrically connect the output power supply voltage VDDO and the pull-up reference voltage VREFP while the pull-up driving signal PG transitions.

Figure 7:
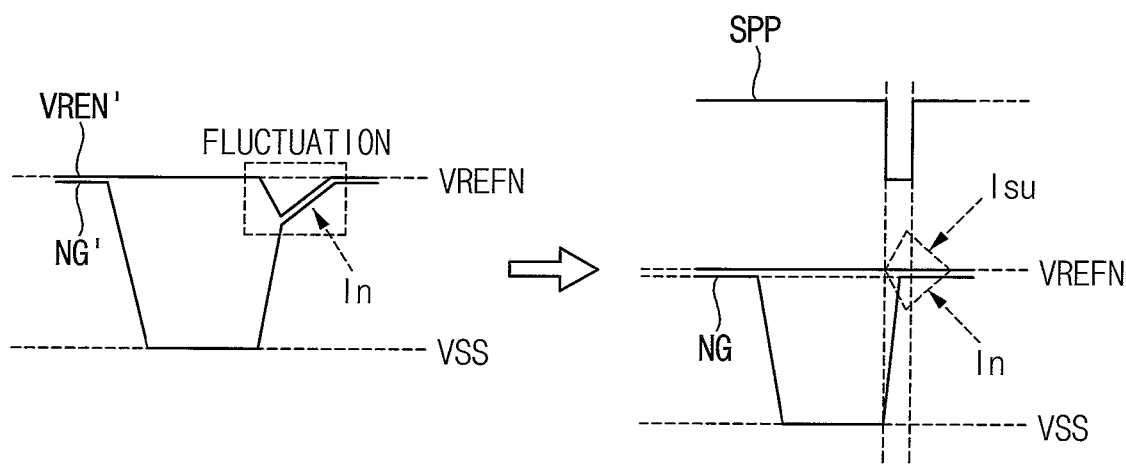
FIG. 7 is a diagram illustrating improvement of a slew rate by the reference voltage compensation circuit of FIG. 5.

FIG. 7 is a diagram illustrating improvement of a slew rate by the reference voltage compensation circuit of FIG. 5.

A pull-down driving signal NG' and a pull-down reference voltage VREFN' when the pull-up short operation according to example embodiments is not performed are illustrated in the left portion of FIG. 7, and a pull-down driving signal NG and a pull-down reference voltage VREFN when the pull-up short operation is performed are illustrated in the right portion of FIG. 7.

When the pull-up short operation is not performed, an operation current In flows from the pull-down reference voltage VREFN to the ground voltage VSS, while the pull-down driving signal NG' transitions from the ground voltage VSS to the pull-down reference voltage VREFN, that is, at the rising edge of the pull-down driving signal NG'. Accordingly there is a fluctuation such that the pull-down reference voltage VREFN' decreases temporarily, and thus the rising time of the pull-down driving signal NG' increases.

In contrast, when the pull-up short operation according to example embodiments is performed, a pull-up short current Isu flowing from the output power supply voltage VDDO to the pull-down reference voltage VREFN may be induced. Accordingly, the fluctuation in the pull-down reference voltage VREFN may be reduced or prevented, and thus the pull-down driving signal NG may have a reduced rising time or an improved slew rate in comparison with the pull-down driving signal NG'.

Figure 8:
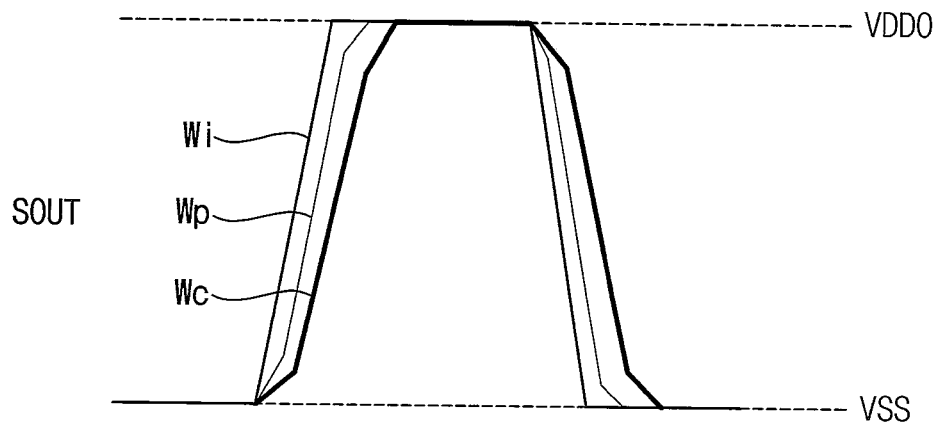
FIG. 8 is a diagram illustrating improvement of a slew rate by an output driver according to example embodiments.

FIG. 8 is a diagram illustrating improvement of a slew rate by an output driver according to example embodiments.

In FIG. 8, Wi indicates a waveform of the output signal SOUT in an ideal case in which there is no voltage fluctuation, Wp indicates a waveform of the output signal SOUT when a short operation according to example embodiments is performed, and We indicates a waveform of the output signal SOUT when the short operation is not performed.

By comparing, as illustrated in FIG. 8, the waveform Wp with the short operation in and the waveform We without the short operation, the short operation may reduce the transition time of the output signal SOUT. The output signal SOUT may transition rapidly from the ground voltage VSS to the output power supply voltage VDDO due to the above-described pull-down short current Isd, and the output signal SOUT may transition rapidly from the output power supply voltage VDDO to the ground voltage VSS due to the above-described pull-up short current Isu.

Figure 9:
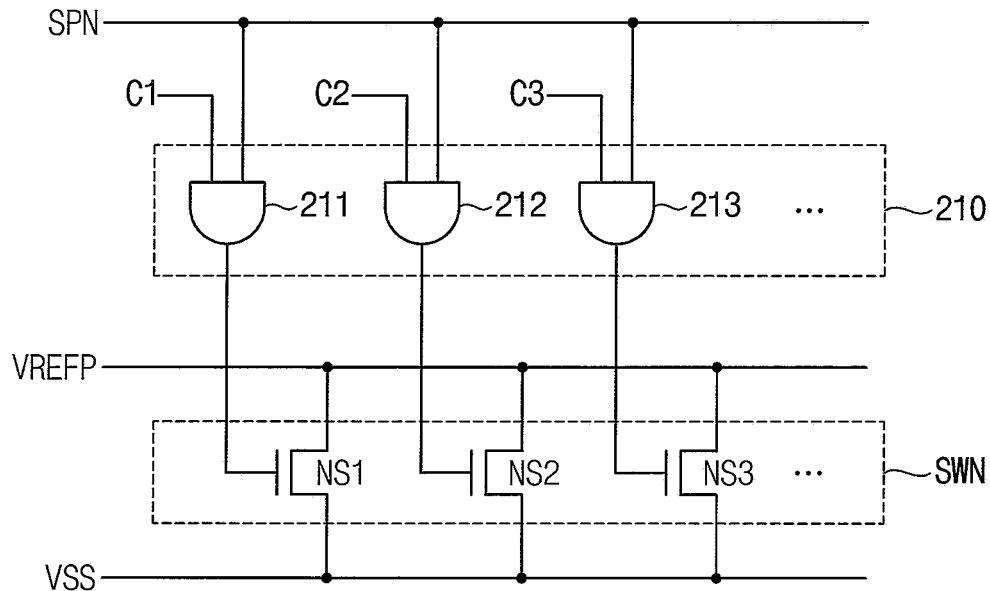
FIGS. 9 and 10 are diagrams illustrating example embodiments of a reference voltage compensation circuit included in an output driver according to example embodiments.
Figure 10:
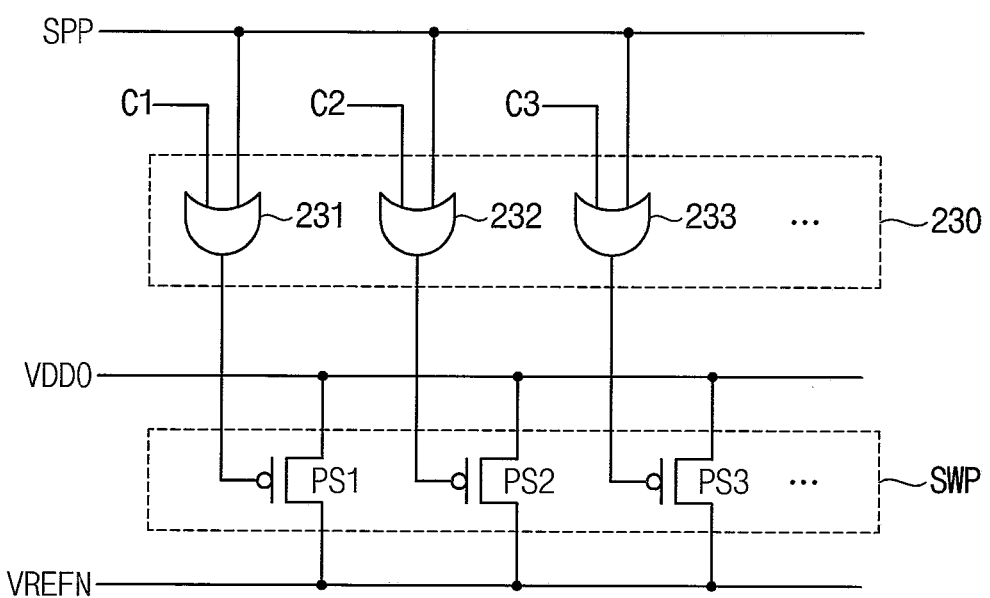

FIGS. 9 and 10 are diagrams illustrating a reference voltage compensation circuit included in an output driver according to example embodiments.

Referring to FIG. 9, the pull-down switch circuit SWN may include a plurality of NMOS transistors NS1~NS3 connected in parallel between the pull-up reference voltage VREFP and the ground voltage VSS. In this case, the above-described reference voltage compensation circuit may further include a short current control circuit 210.

In some example embodiments, the short current control circuit 210 may include a plurality of AND gates 211~213. The AND gates 211~213 may generate gate signals of the plurality of NMOS transistors NS1~NS3 by performing logic operations on the pull-down pulse signal SPN and code bits C1~C3, respectively.

The code bits C1~C3 may be provided from a core logic circuit in a semiconductor device including the output driver and the code bits C1~C3 may be determined, for example by the core logic circuit, based on an output impedance of the output driver. For example, the code bits C1~C3 may be a temperature code that increases as the output impedance increases. Each AND gate may output the gate signal corresponding to the pull-down pulse signal SPN when the corresponding code bit is "1". In contrast, when the corresponding code bit is "0", each AND gate may mask the pull-down pulse signal SPN such that the gate signal may maintain a low voltage level to turn off the NMOS transistor. As the output impedance of the output driver increases, the number of the transistors among the plurality of NMOS transistors NS1~NS3 may be increased to increase the above-described pull-down short current Isd.

Referring to FIG. 10, the pull-up switch circuit SWP may include a plurality of PMOS transistors PS1~PS3 connected in parallel between the output power supply voltage VDDO and the pull-down reference voltage VREFN. In this case, the above-described reference voltage compensation circuit may further include a short current control circuit 230.

In some example embodiments, the short current control circuit 230 may include a plurality of OR gates 231~233. The OR gates 231~233 may generate gate signals of the plurality of PMOS transistors PS1~PS3 by performing logic operations on the pull-up pulse signal SPP and code bits C1~C3, respectively.

The code bits C1~C3 may be provided from a core logic circuit in a semiconductor device including the output driver and the code bits C1~C3 may be determined, for example by the core logic circuit, based on an output impedance of the output driver. For example, the code bits C1~C3 may be a temperature code that increases as the output impedance increases. Each OR gate may output the gate signal corresponding to the pull-up pulse signal SPP when the corresponding code bit is "0". In contrast, when the corresponding code bit is "1", each OR gate may mask the pull-up pulse signal SPP such that the gate signal may maintain a high voltage level to turn off the PMOS transistor. As the output impedance of the output driver increases, the number of the transistors among the plurality of PMOS transistors PS1~PS3 may be increased to increase the above-described pull-up short current Isu.

As described with reference to FIGS. 9 and 10, the switch circuits SWP and SWN in the reference voltage compensation circuit may include a plurality of transistors connected in parallel between the pull-up reference voltage VREFP and the ground voltage VSS or between the pull-down reference voltage VREFN and the output power supply voltage VDDO. The short current control circuits 210 and 230 may control, based on an output impedance of the output driver, the number of transistors that are turned on among the plurality of transistors.

Figure 11:
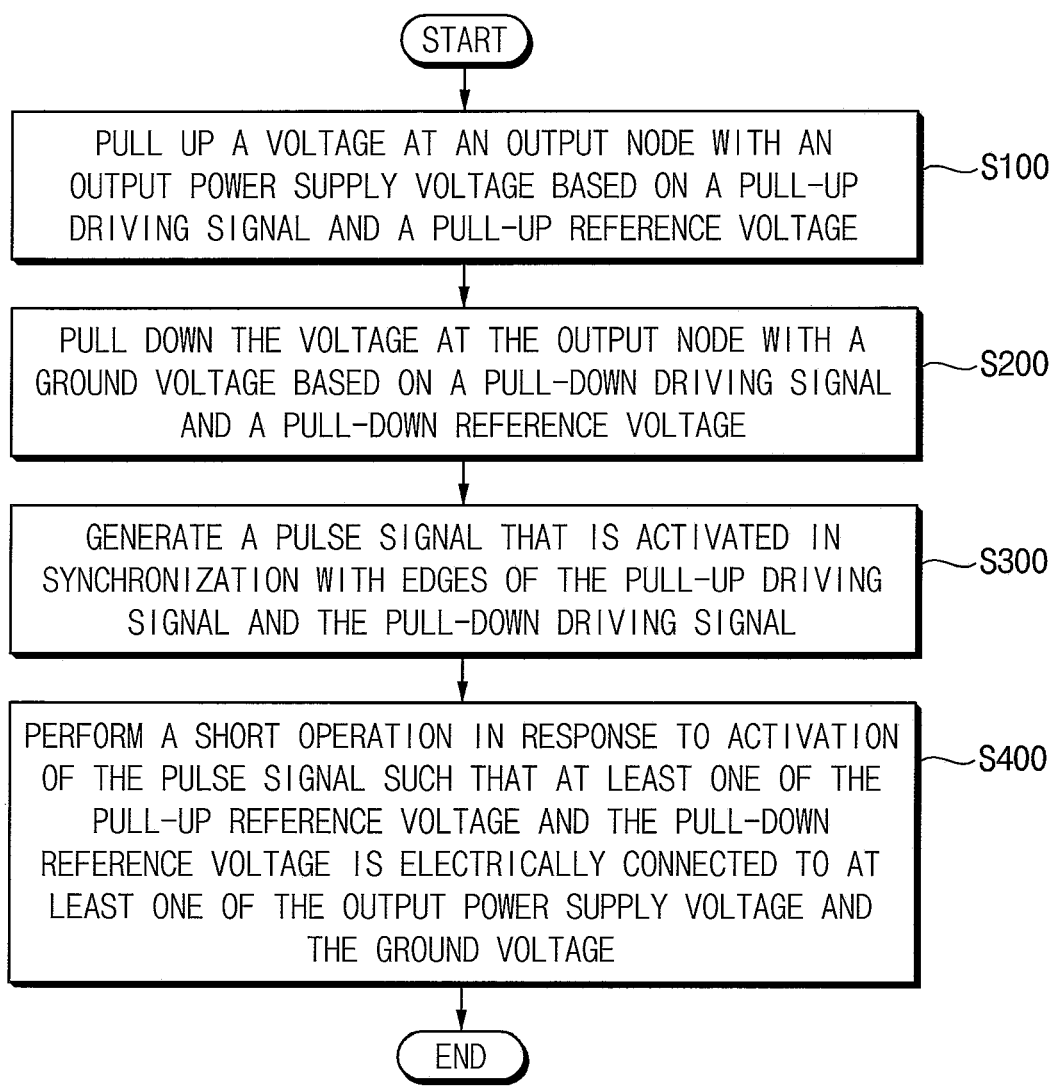
FIG. 11 is a flow chart illustrating a method of compensating for a reference voltage according to example embodiments.

FIG. 11 is a flow chart illustrating a method of compensating for a reference voltage according to example embodiments.

Referring to FIGS. 1 and 11, using the pull-up driver 440, the voltage at the output node NO may be pulled up with the output power supply voltage VDDO based on the pull-up driving signal PG and the pull-up reference voltage VREFP (S100).

Using the pull-down driver 420, the voltage at the output node NO may be pulled down with the ground voltage VSS based on the pull-down driving signal NG and the pull-down reference voltage VREFN (S200).

Using the pulse signal generation circuit PPGN and NPGM, the pulse signal SPP and SPN, which is activated in synchronization with edges of the pull-up driving signal PG and the pull-down driving signal NG may be generated (S300).

Using the switch circuit SWP and SWN, the short operation may be performed based on activation of the pulse signal SPP and SPN such that at least one of the pull-up reference voltage VREFP and the pull-down reference voltage VREFN may be electrically connected to at least one of the output power supply voltage VDDO and the ground voltage VSS (S400).

Figure 12:
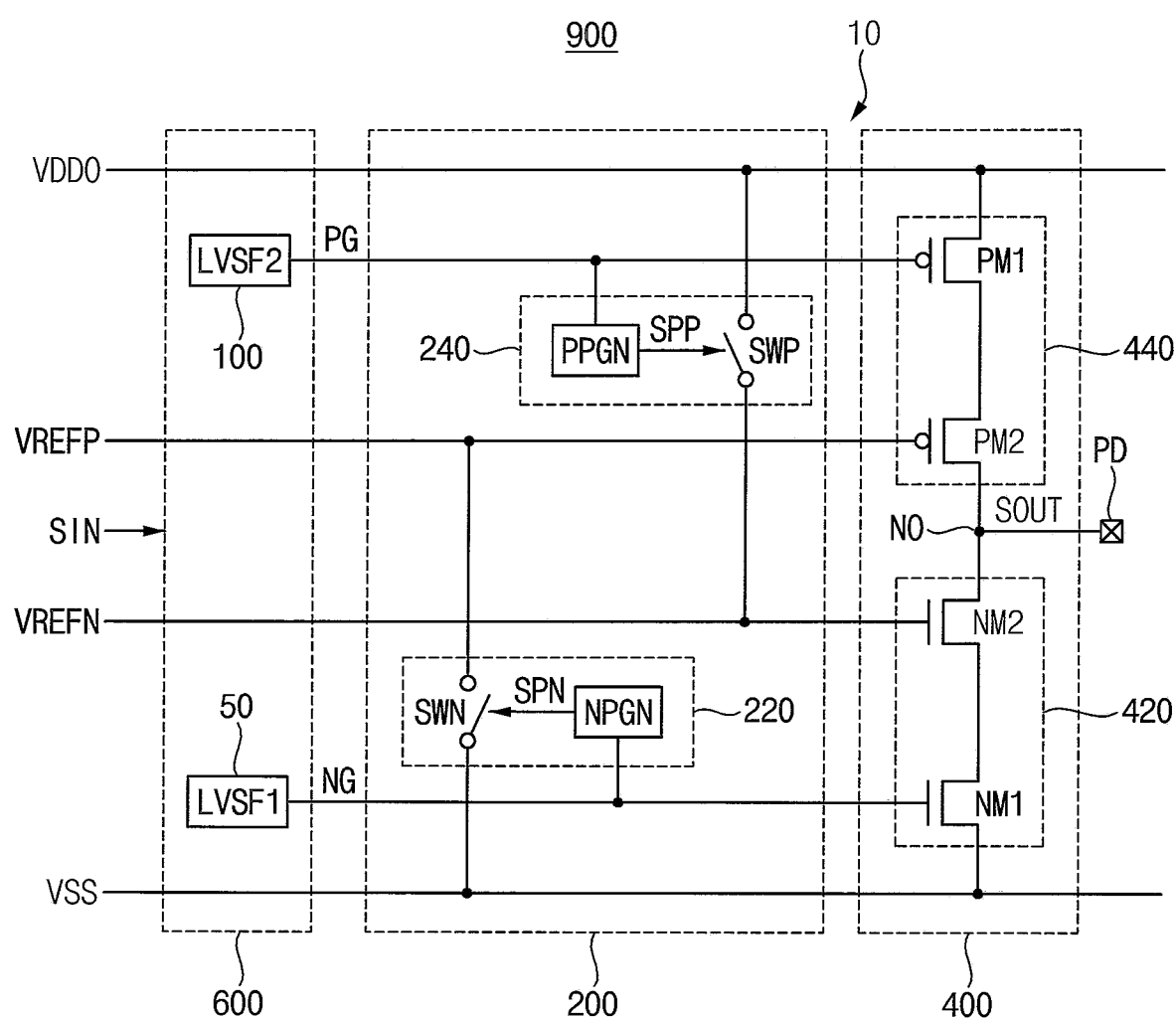
FIG. 12 is a diagram illustrating an output buffer circuit according to example embodiments.

FIG. 12 is a diagram illustrating an output buffer circuit according to example embodiments.

Referring to FIG. 12, an output buffer circuit 900 may include an output driver 10 and a level shifting circuit 600.

The output driver 10 may include a reference voltage compensation circuit 200 and a driving circuit 400. The driving circuit 400 may include a pull-down driver 420 and a pull-up driver 440, and the reference voltage compensation circuit 200 may include at least one of a first reference voltage compensation circuit 220 and a second reference voltage compensation circuit 240. To perform the above-described short operation, the first reference voltage compensation circuit 220 may include a pull-down pulse generation circuit NPGN and a pull-down switch circuit SWN, and the second reference voltage compensation circuit 240 may include a pull-up pulse generation circuit NPGP and a pull-up switch circuit SWP. The output driver 10 is the same as described with reference to FIG. 1, and repeated descriptions are omitted.

The level shifting circuit 600 may generate the pull-up driving signal PG and the pull-down driving signal NG based on an input signal SIN. In some example embodiments, the level shifting circuit 600 may include a first level shifter LVSF1 50 and a second level shifter LVSF2 100.

The first level shifter 50 may generate the pull-down driving signal NG transitioning between the pull-down reference voltage VREFN and the ground voltage VSS by converting a voltage level of the input signal SIN. The second level shifter 100 may generate the pull-up driving signal PG transitioning between the output power supply voltage VDDO and the pull-up reference voltage VREFP by converting a voltage level of the pull-down driving signal NG.

Hereinafter, example embodiments of the first level shifter 50 and the second level shifter 100 are described. The level shifting circuit 600 is not limited to configurations of FIGS. 13 and 14, and may be implemented with various configurations.

Figure 13:
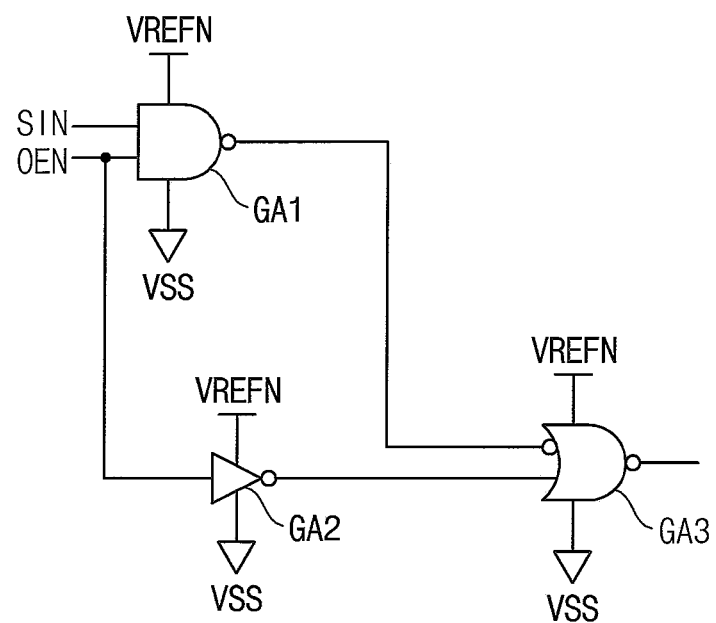
FIG. 13 is a circuit diagram illustrating an example embodiment of a first level shifter included in the output buffer circuit of FIG. 12.

FIG. 13 is a circuit diagram illustrating an example embodiment of a first level shifter included in the output buffer circuit of FIG. 12.

Referring to FIG. 13, a first level shifter 50 may include a first logic gate GA1, a second logic gate GA2 and a third logic gate GA3. The first logic gate GA1 may be a NAND gate, the second logic gate GA2 may be an inverter and the third logic gate GA3 may be a NOR gate.

The first logic gate GA1 may perform a NAND logic operation on the input signal SIN and an output enable signal OEN. The second logic gate GA2 may invert the output enable signal OEN. The third logic gate GA3 may perform a NOR logic operation on the outputs of the first logic gate GA1 and GA2 to generate the pull-down driving signal NG.

The first logic gate GA1, the second logic gate GA2 and the third logic gate GA3 may operate based on the pull-down reference voltage VREFN and the ground voltage VSS. As such, the first level shifter 50 may generate the pull-down driving signal NG transitioning between the pull-down reference voltage VREFN and the ground voltage VSS by gating the input signal SIN based on the output enable signal OEN.

Figure 14:
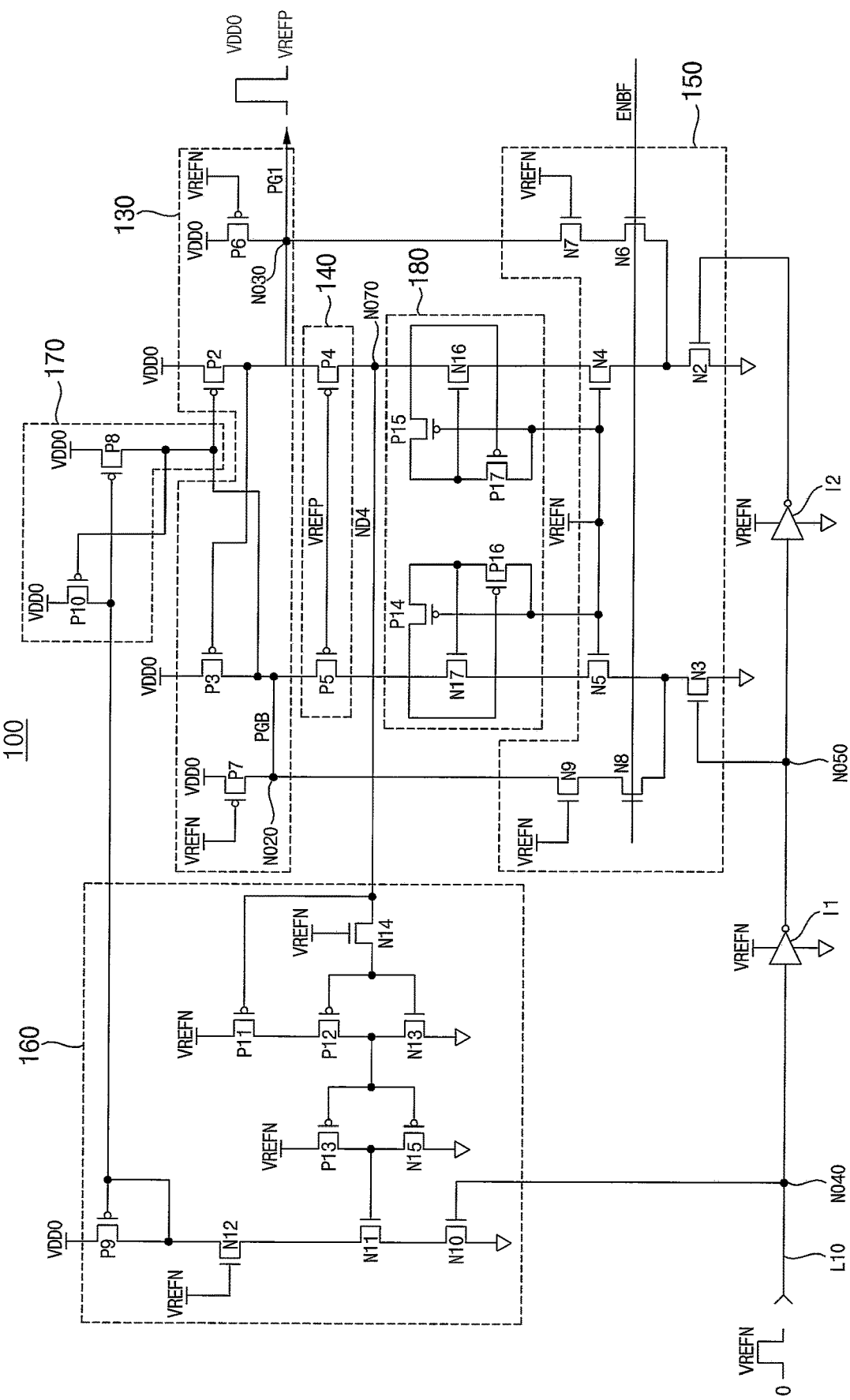
FIG. 14 is a circuit diagram illustrating an example embodiment of a second level shifter included in the output buffer circuit of FIG. 12.

FIG. 14 is a circuit diagram illustrating an example embodiment of a second level shifter included in the output buffer circuit of FIG. 12. A second level shifter 100 of FIG. 14 may have a high voltage tolerance to generate the pull-up driving signal PG applied to the pull-up driver 440.

Referring to FIG. 14, the second level shifter 100 includes a pull-up circuit 130 and a pull-down circuit 150 connected to each other through a biasing circuit 140 constituted by PMOS transistors P4 and P5.

The second level shifter 100 may further include a speed up circuit 160 to increase a level shifting operation speed of the input data being applied to a line L10 through the first gating node.

The second level shifter 100 may further include a data contention prevention circuit 170 to prevent a data contention of an output node NO30 to output the pull-up driving signal PG1 by turning off pull-up transistors P2 in the pull-up circuit 130 before pull-down transistors N2 in the pull-down circuit 150 operate. The data contention prevention circuit 170 is connected between the speed up circuit 160 and the pull-up circuit 130.

The second level shifter 100 may further include a hot carrier injection prevention circuit 180 to prevent a hot carrier from being injected into pull-down transistors N2~N9 of the pull-down circuit 150. The hot carrier injection prevention circuit 180 may be connected between the biasing circuit 140 and the pull-down circuit 150.

The second level shifter 100 of FIG. 14 is a high voltage tolerant level shifter and receives the pull-down reference voltage VREFN, as input data, having a swing level from the ground voltage VSS to the pull-down reference voltage VREFN to output the pull-up driving signal PG1 having a swing level from the pull-up reference voltage VREFP to the output power supply voltage VDDO to the output node NO30. If the input data is toggled from the ground voltage VSS to the pull-down reference voltage VREFN, the pull-up driving signal PG1, which is an enable signal of the pull-up driver 440, is also toggled from the pull-up reference voltage VREFP to the output power supply voltage VDDO. If the input data is toggled from the pull-down reference voltage VREFN to the ground voltage VSS, the pull-up driving signal PG1 is toggled from the output power supply voltage VDDO to the pull-up reference voltage VREFP.

The hot carrier injection prevention circuit 180 may include PMOS transistors P14-P17 and NMOS transistors N16 and N17 so that a voltage difference between drains and sources of pull-down transistors N4 and N5 in the pull-down circuit 150 may be controlled. The hot carrier injection prevention circuit 180 reduces a drain-source voltage of the pull-down transistors N4 and N5 when the pull-up driving control voltage is toggled. As a result, occurrence of a hot carrier injection (HCI) phenomenon of a level shifter is suppressed.

The data contention prevention circuit 170 may include PMOS transistors P8 and P10 of which gates are connected to mutual drains of the PMOS transistors P10 and P8 respectively.

The speed up circuit 160 is connected to the line L10 and may include a plurality of PMOS transistors P9, P11-P13 and a plurality of NMOS transistors N10-N15 to kick (start) an operation of the data contention prevention circuit 170. The speed up circuit 160 makes the data contention prevention circuit 170 smoothly perform a data contention prevention operation (e.g., an operation of turning off the PMOS transistor P2 in advance). As a result, the speed up circuit 160 may increase a level shifting operation speed. If a level of input data being applied to the line L10 transits from the ground voltage VSS to the pull-down reference voltage VREFN, the NMOS transistor N2 in the pull-down circuit 150 starts to be turned on. At this time, the PMOS transistor P2 maintains a turn-on state during a specific time section without being turned off. During a turn-on operation of the PMOS transistor P2, a voltage level of a signal ND4 at a node NO70 is held on a level around the output power supply voltage VDDO. Thus, to rapidly lower the voltage level of ND4, the NMOS transistor N14 in the speed up circuit 160 is turned on, and then the NMOS transistor N13 and the PMOS transistor P13 in the speed up circuit 160 are sequentially turned on. The NMOS transistor N11 is turned on and the NMOS transistor N10 is turned on by the input data. A voltage level of the signal ND4 rapidly descends toward a ground level. Because a gate voltage of the PMOS transistor P9 descends toward a low level, the PMOS transistor P8 of the data contention prevention circuit 170 is turned on and thereby the PMOS transistor P2 for pull-up in the pull-up circuit 130 is finally turned on. By turning off the PMOS transistor P2 for pull-up in the pull-up circuit 130 before the NMOS transistor N2 for pull-down in the pull-down circuit 150 operates, a data contention of output terminal NO30 from which the pull-up driving signal PG1 is output may be prevented or minimized.

In FIG. 14, the NMOS transistors N6 and N8 receive an enable signal ENBF of a high level through their gates to operate when the output power supply voltage VDDO of a lower voltage (e.g., 1.8V) is given. In this case, the second level shifter 100 may function as a level shifter of 1.8V. An inverter I1 is connected between a node NO40 and a node NO50, and an inverter I2 is connected between the node NO50 and the pull-down circuit 150.

In the level shifter of FIG. 14, transistor elements constituting the data contention prevention circuit 170, the speed up circuit 160 and the hot carrier injection prevention circuit 180 may be manufactured using a CMOS transistor manufacturing process for an operation of the pull-down reference voltage VREFN (e.g., 1.8V). In addition, the second level shifter 100 of FIG. 14 is a level shifter to shift a level variable between the pull-up reference voltage VREFP (e.g., 1.5V) and the output power supply voltage VDDO (e.g., 3.3V).

If a level of input data is the ground voltage VSS (e.g., 0V), a level of the pull-up driving signal PG1 becomes the pull-up reference voltage VREFP. If the input data is toggled from the ground voltage VSS to the pull-down reference voltage VREFN, the pull-up driving signal PG1 is toggled from the pull-up reference voltage VREFP to the output power supply voltage VDDO.

The PMOS transistors P2 and P3 of the pull-up circuit 130 and the NMOS transistors N2 and N3 of the pull-down circuit 150 constitute a level shifter of a latch type. The PMOS transistors P4 and P5 receive the pull-up reference voltage VREFP through their gates. By setting up the PMOS transistors P4 and P5, drain-source voltages of the PMOS transistors P2 and P3 of the pull-up circuit 130 are maintained below a level of the pull-down reference voltage VREFN (e.g., 1.8V). Because a high voltage is not applied between drains and sources of the PMOS transistors P2 and P3 of the pull-up circuit 130, occurrence of HCI phenomenon is prevented.

Also, by setting up the NMOS transistors N4 and N5, drain-source voltages of the NMOS transistors N2 and N3 of the pull-down circuit 150 are maintained below a level of the pull-down reference voltage VREFN (e.g., 1.8V). Because a high voltage is not applied between drains and sources of the NMOS transistors N2 and N3 of the pull-down circuit 150, occurrence of HCI phenomenon is prevented.

During a transition operation in which an output voltage of the output node NO30 is changed, the drain-source voltage of the NMOS transistors N4 and N5 may be the pull-down reference voltage VREFN or more. To prevent device degradation due to HCI, the hot carrier injection prevention circuit 180 is prepared. The hot carrier injection prevention circuit 180 makes the drain-source voltage of the NMOS transistors N4 and N5 become the pull-down reference voltage VREFN or less.

The PMOS transistor P2, the NMOS transistor N2, the PMOS transistor P3 and the NMOS transistor N3 in the level shifter of latch type may have a contention operation section in which they are turned on at the same time. The contention operation section may cause speed to be reduced. The data contention prevention circuit 170 constituted by the PMOS transistors P8 and P9 turns off the PMOS transistor P2 before the NMOS transistor is turned on and minimizes or removes the contention operation section.

A size of the PMOS transistor P3 may be minimized or reduced by the transistors N10-N14 and P8-P13 constituting the speed up circuit 160 and the data contention prevention circuit 170. Thus, when the NMOS transistor N3 is turned on, a contention operation section in which the PMOS transistor is turned on is minimized.

A PGB voltage of the node NO20 rises toward a high level set by a turn-on operation of the PMOS transistor P8 and after the PGB voltage rises to the high level, the PMOS transistor P8 is turned off. After that, the PGB voltage maintains the high level by the PMOS transistor P3. Although the size of the PMOS transistor P3 is small, the PGB voltage can maintain the high level by the transistors constituting the speed up circuit 160 and the data contention prevention circuit 170. The speed up circuit 160 allows the level shifter to operate at a frequency, for example, 200 MHz or more.

Figure 15:
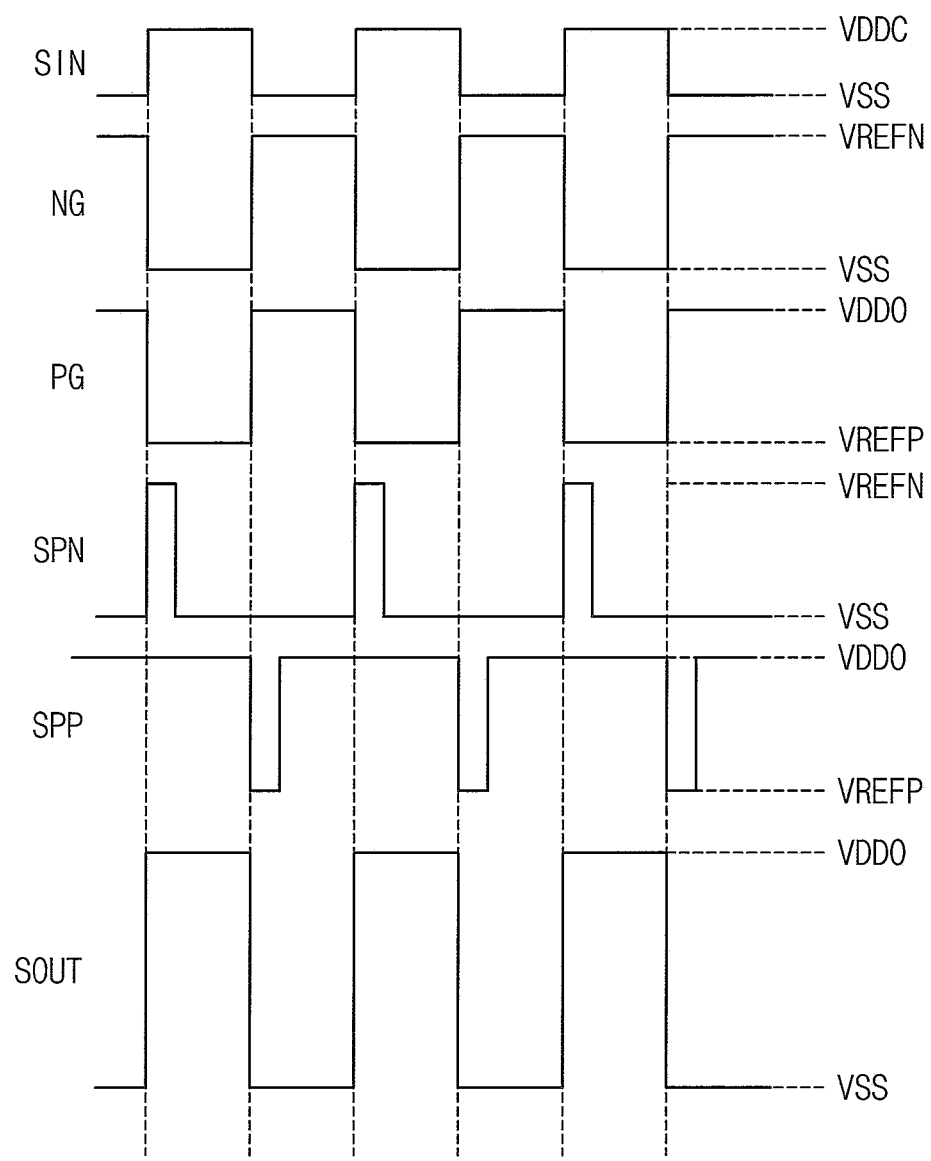
FIG. 15 is a timing diagram illustrating an example operation of an output buffer circuit according to example embodiments.

FIG. 15 is a timing diagram illustrating an example operation of an output buffer circuit according to example embodiments.

Referring to FIGS. 12 through 15, the output buffer circuit 900 may output the output signal SOUT through the pad PD connected to the output node NO by buffering the input signal SIN. The input signal SIN may transition or swing between a core power supply voltage VDDC and the ground voltage VSS, the output signal SOUT may transition between the output power supply voltage VDDO and the ground voltage VSS. The output power supply voltage VDDO may have a higher level than the core power supply voltage VDDC.

The pull-down driving signal NG may transition between the ground voltage VSS and the pull-down reference voltage VREFN higher than the ground voltage VSS. The pull-up driving signal PG may transition between the output power supply voltage VDDO and the pull-up reference voltage VREFP lower than the output power supply voltage VDDO. In some example embodiments, the pull-down reference voltage VREFN (e.g., 1.8V) may be higher than the pull-up reference voltage VREFP (e.g., 1.5V).

The pull-down pulse signal SPN may include pulses that are activated in synchronization with falling edges of the pull-down driving signal NG. In some example embodiments, the pull-down pulse signal SPN may have a deactivated level corresponding to the ground voltage VSS and include positive pulses having an activated level corresponding to the pull-down reference voltage VREFN.

The pull-up pulse signal SPP may include pulses that are activated in synchronization with rising edges of the pull-up driving signal PG. In some example embodiments, the pull-up pulse signal SPP may have a deactivated level corresponding to the output power supply voltage VDDO and include negative pulses having an activated level corresponding to the pull-up reference voltage VREFP.

The output buffer circuit 900 of FIG. 12 may be a high-speed high-voltage circuit having a wide range output such that the output signal SOUT may transition or toggle between the ground voltage VSS and the output power supply voltage VDDO corresponding to a high voltage, even though the output buffer circuit 900 includes low voltage components. For example, the output power supply voltage VDDO may be about 3.3V, the pull-up reference voltage VREFP may be about 1.5V, the pull-down reference voltage VREFN may be about 1.8V and the ground voltage VSS may be about 0V. In this case, damage to the devices (e.g., transistors) by the 3.3V operation may be reduced or prevented even though the output buffer circuit 900 is manufactured using components configured to withstand a voltage of about 1.8V.

Figure 16:
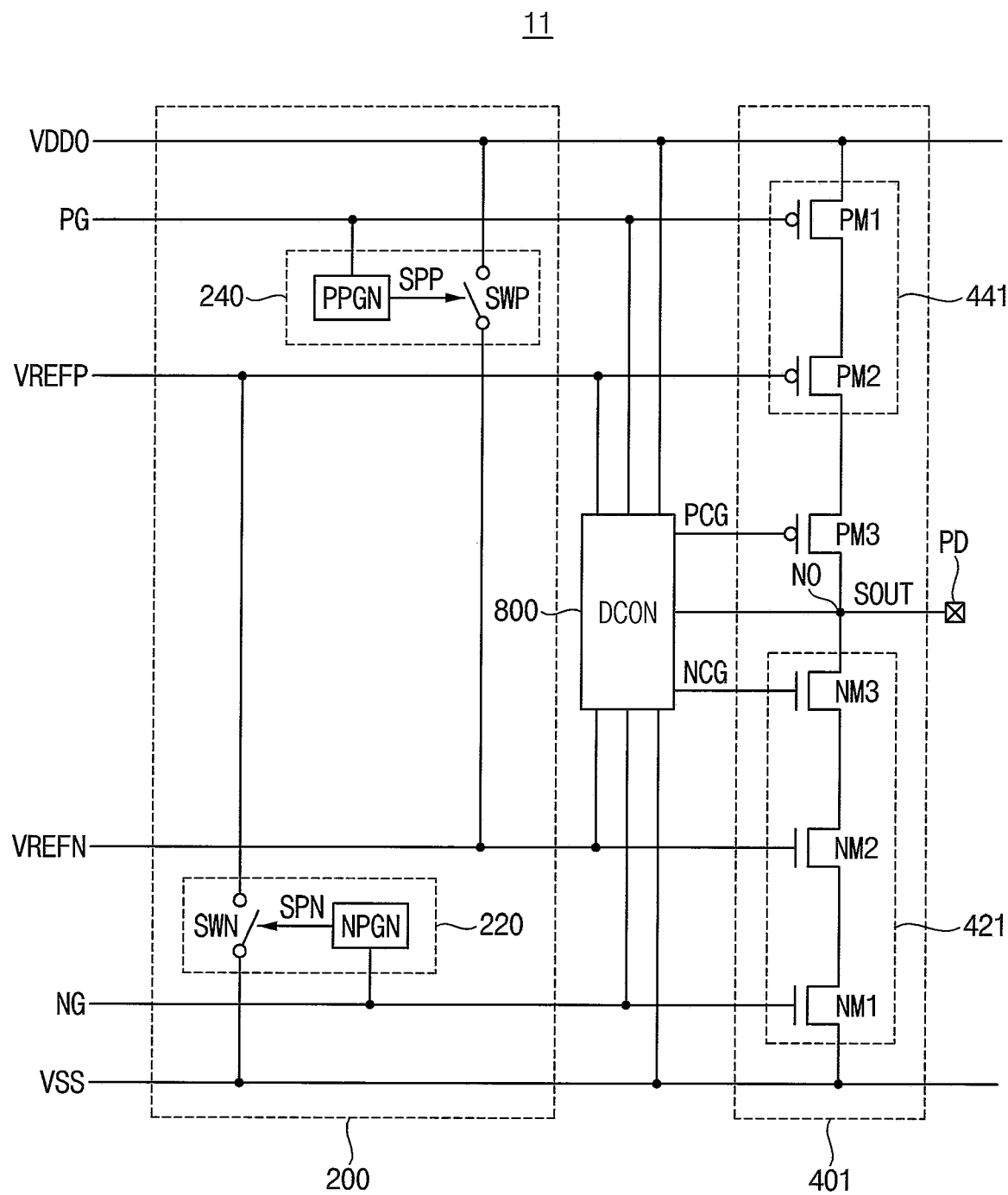
FIG. 16 is a diagram illustrating an output driver according to example embodiments.

FIG. 16 is a diagram illustrating an output driver according to example embodiments.

Referring to FIG. 16, an output driver 11 includes a reference voltage compensation circuit 200, a driving circuit 401 and a dynamic control circuit DCON 800.

The driving circuit 401 may include a pull-down driver 421 and a pull-up driver 441. The pull-up driver 441 may be connected between an output power supply voltage VDDO and an output node NO generating an output signal SOUT. The pull-up driver 441 may pull up a voltage at the output node NO based on a pull-up driving signal PG and a pull-up reference voltage VREFP. The pull-down driver 421 may be connected between the output node NO and a ground voltage VSS. The pull-down driver 421 may pull down the voltage at the output node NO based on a pull-down driving signal NG and a pull-down reference voltage VREFN.

The output signal SOUT may be provided to an external device through a pad PD connected to the output node NO.

The reference voltage compensation circuit 200 may perform a short operation during transitions of the pull-up driving signal PG and the pull-down driving signal NG. For example, the reference voltage compensation circuit 200 may electrically connect at least one of the pull-up reference voltage VREFP and the pull-down reference voltage VREFN to at least one of the output power supply voltage VDDO and the ground voltage VSS.

The reference voltage compensation circuit 200 may include at least one of a first reference voltage compensation circuit 220 and a second reference voltage compensation circuit 240. The first reference voltage compensation circuit 220 may perform a pull-down short operation during transitions of the pull-down driving signal NG such that the pull-up reference voltage VREFP is electrically connected to the ground voltage VSS. The second reference voltage compensation circuit 240 may perform a pull-up short operation during transitions of the pull-up driving signal PG such that the pull-down reference voltage VREFN is electrically connected to the output power supply voltage VDDO.

To perform such short operation, the first reference voltage compensation circuit 220 may include a pull-down pulse generation circuit NPGN and a pull-down switch circuit SWN and the second reference voltage compensation circuit 240 may include a pull-up pulse generation circuit PPGN and a pull-up switch circuit SWP.

In some example embodiments, as described below with reference to FIGS. 2 and 3, the pull-down pulse generation circuit NPGN may generate a pull-down pulse signal SPN that is activated at falling edges of the pull-down pulse signal. The pull-down switch circuit SWN may electrically connect the pull-up reference voltage VREFP and the ground voltage VSS based on activation of the pull-down pulse signal SPN.

In some example embodiments, as described below with reference to FIGS. 5 and 6, the pull-up pulse generation circuit PPGN may generate a pull-up pulse signal SPP that is activated at rising edges of the pull-up driving signal PG. The pull-up switch circuit SWP may electrically connect the pull-down reference voltage VREFN and the output power supply voltage VDDO based on activation of the pull-up pulse signal SPP.

As such, the reference voltage compensation circuit 200 may include a pulse generation circuit PPGN and/or NPGN configured to generate a pulse signal SPP and/or SPN that is activated in synchronization with edges of the pull-up driving signal PG and/or NG, and a switch circuit SWP and/or SWN configured to perform the short operation based on activation of the pulse signal SPP and/or SPN.

In some example embodiments, the reference voltage compensation circuit 200 may include only the first reference voltage compensation circuit 220. In this case, the reference voltage compensation circuit 200 may perform only the pull-down short operation to electrically connecting the pull-up reference voltage VREFP and the ground voltage VSS.

In some example embodiments, the reference voltage compensation circuit 200 may include only the second reference voltage compensation circuit 240. In this case, the reference voltage compensation circuit 200 may perform only the pull-up short operation to electrically connecting the pull-down reference voltage VREFN and the output power supply voltage VDDO.

In some example embodiments, the reference voltage compensation circuit 200 may include both of the first reference voltage compensation circuit 220 and the second reference voltage compensation circuit 240. In this case, the reference voltage compensation circuit 200 may perform both of the pull-down short operation and the pull-up short operation.

The pull-up driver 441 may include a pull-up driving transistor PM1, a pull-up bias transistor PM2 and a pull-up control transistor PM2 connected by a cascode structure between the output power supply voltage VDDO and the output node NO. The pull-up driving signal PG may be applied to a gate electrode of the pull-up driving transistor PM1, the pull-up reference voltage VREFP may be applied to a gate electrode of the pull-up bias transistor PM2, and a pull-down control signal PCG may be applied to a gate electrode of the pull-up control transistor PM3. The pull-up driving transistor PM1, the pull-up bias transistor PM2 and the pull-up control transistor PM3 may be PMOS transistors.

The pull-down driver 421 may include a pull-down driving transistor NM1, a pull-down bias transistor NM2 and a pull-down control transistor NM3 connected by a cascode structure between the output node NO and the ground voltage VSS. The pull-down driving signal NG may be applied to a gate electrode of the pull-down driving transistor NM1, the pull-down reference voltage VREFN may be applied to a gate electrode of the pull-down bias transistor NM2 and a pull-down control signal NCG may be applied to a gate electrode of the pull-down control transistor NM3. The pull-down driving transistor NM1, the pull-down bias transistor NM2 and the pull-down control transistor NM3 may be NMOS transistors.

FIG. 16 illustrate an example embodiment of the driving circuit 401 having three-stage stack structure. The output driver 11 of FIG. 16 may be a high-speed high-voltage circuit having a wide range output such that the output signal SOUT may transition or toggle between the ground voltage VSS and the output power supply voltage VDDO corresponding to a high voltage, even though the output driver 10 is includes low voltage components. For example, the output power supply voltage VDDO may be about 3.3V, the pull-up reference voltage VREFP may be about 1.5V, the pull-down reference voltage VREFN may be about 1.8V and the ground voltage VSS may be about 0V. In this case, damage to the devices (e.g., transistors) by the 3.3V operation may be reduced or prevented even though the output driver 10 is manufactured using components configured to withstand a voltage of about 1.8V.

The dynamic control circuit 800 may generate the pull-up control signal PCG and the pull-down control signal NCG. The dynamic control circuit 800 may receive, as operation voltages, the output power supply voltage VDDO, the pull-up reference voltage VREFP, the pull-down reference voltage VREFN and the ground voltage VSS, and generate the pull-up control signal PCG and the pull-down control signal NCG based on the output signal SOUT, the pull-up driving signal PG and the pull-down driving signal NG. An example embodiment of the dynamic control circuit 800 is described with reference to FIG. 17, and example embodiments are not limited to the configuration of FIG. 17.

Figure 17:
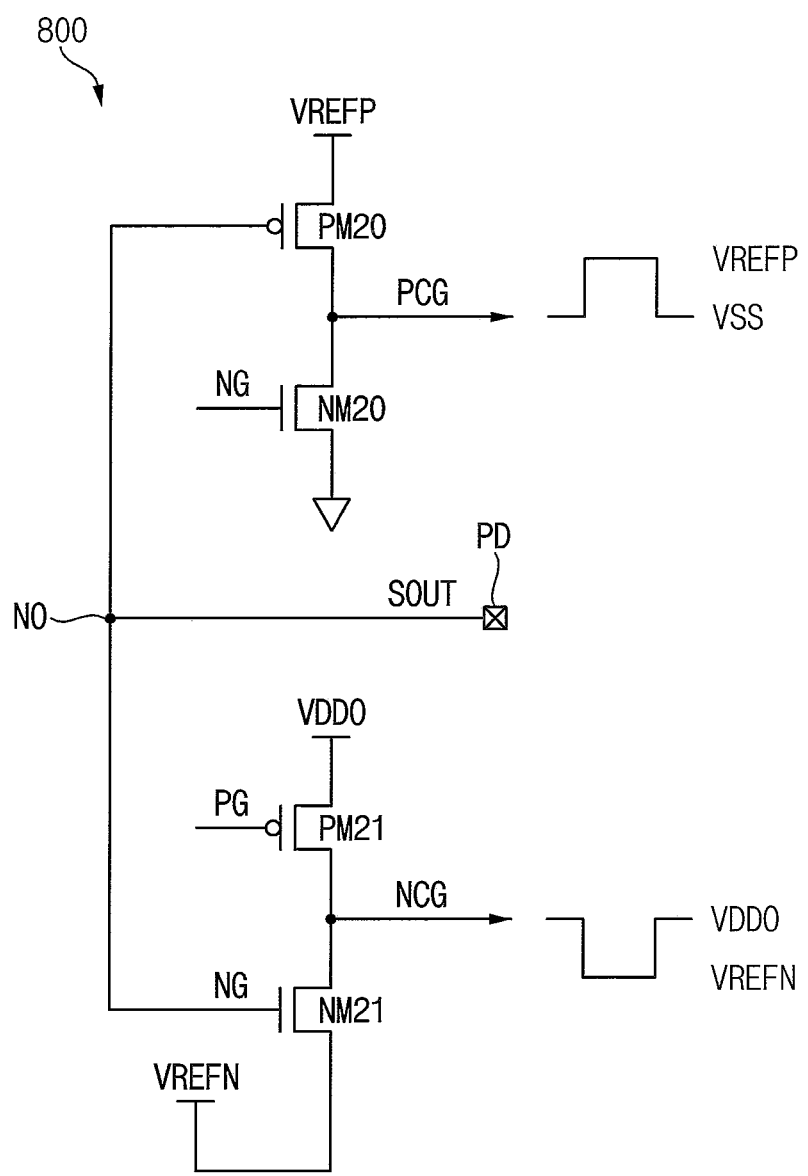
FIG. 17 is a circuit diagram illustrating an example embodiment of a dynamic control circuit included in the output driver of FIG. 16.

FIG. 17 is a circuit diagram illustrating an example embodiment of a dynamic control circuit included in the output driver of FIG. 16.

Referring to FIG. 17, a dynamic control circuit 800 may include a first NMOS transistor NM20 and a first PMOS transistor PM20 connected by a CMOS structure between the pull-up reference voltage VREFP and the ground voltage VSS.

A gate electrode of the first PMOS transistor PM20 may be connected to the output node NO to receive the output signal SOUT and a gate electrode of the first NMOS transistor NM20 may receive the pull-down driving signal NG. The pull-up control signal PCG may be output through a common drain electrode of the first PMOS transistor PM20 and the first NMOS transistor NM20. The pull-up control signal PCG may transition between the pull-up reference voltage VREFP and the ground voltage VSS.

In addition, the dynamic control circuit 800 may include a second NMOS transistor NM21 and a second PMOS transistor PM21 connected by a CMOS structure between the output power supply voltage VDDO and the pull-down reference voltage VREFN.

A gate electrode of the second NMOS transistor NM21 may be connected to the output node NO to receive the output signal SOUT and a gate electrode of the second PMOS transistor PM21 may receive the pull-up driving signal PG. The pull-down control signal NCG may be output through a common drain electrode of the second PMOS transistor PM21 and the second NMOS transistor NM21. The pull-down control signal NCG may transition between the output power supply voltage VDDO and the pull-down reference voltage VREFN.

The dynamic control circuit 800 may adjust voltage levels of the pull-up control signal PCG and the pull-down control signal NCG based on the feedback output signal SOUT. If the output signal SOUT is the low level, the voltage level of the pull-up control signal PCG is the ground voltage VSS and the voltage level of the pull-down control signal NCG is the pull-down reference voltage VREFN. If the output signal SOUT is the high level, the voltage level of the pull-up control signal PCG is the pull-up reference voltage VREFP and the voltage level of the pull-down control signal NCG is the output power supply voltage VDDO.

By adding the pull-up control transistor PM3 and the pull-down control transistor NM3 controlled by the pull-up control signal PCG and the pull-down control signal NCG, damage of the transistors in the driving circuit 401 may be minimized or prevented by preventing the drain-source voltage of the transistors from exceeding a maximum voltage.

As such, the output driver and the output buffer circuit including the output driver according to example embodiments may realize high voltage input-output without high voltage components. In addition, the output driver and the output buffer circuit according to example embodiments may stabilize the reference voltage and improve a slew rate or a transition delay of the output signal by compensating for fluctuation of the reference voltage through the short operation.

Figure 18:
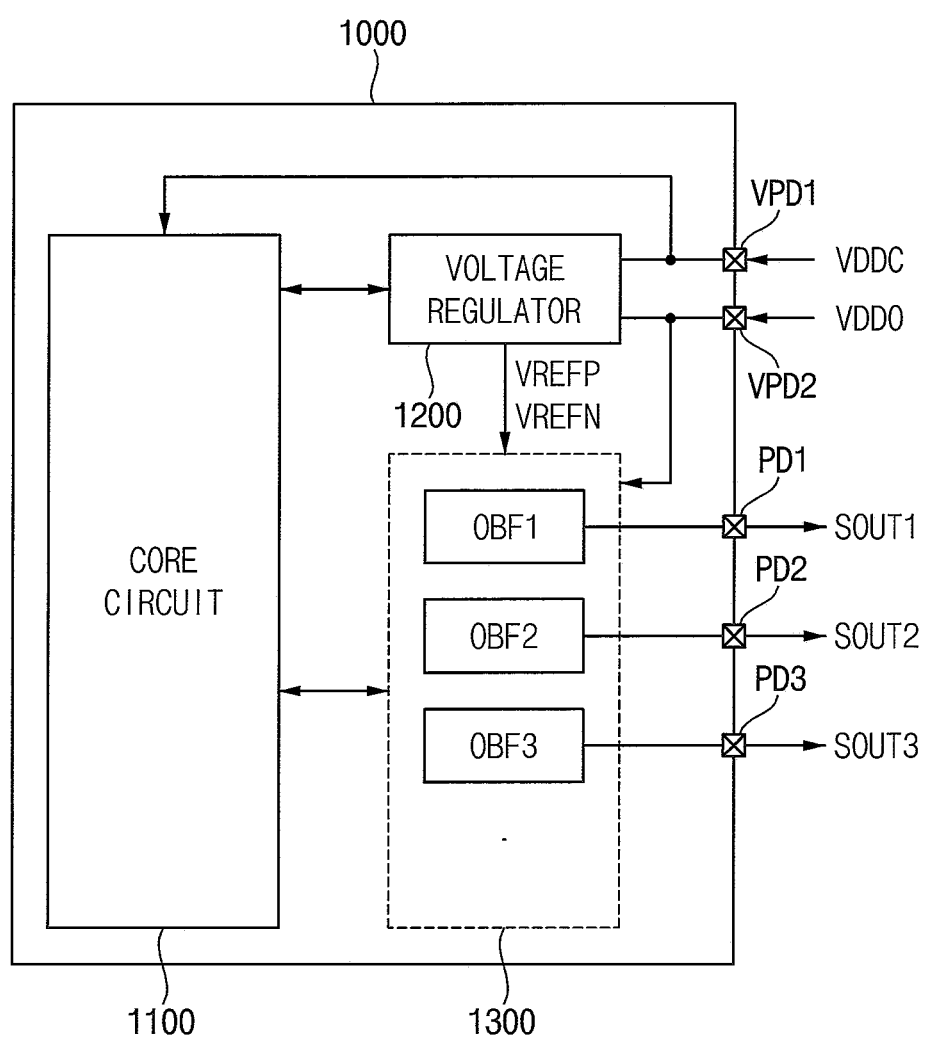
FIG. 18 is a block diagram illustrating a semiconductor device according to example embodiments.

FIG. 18 is a block diagram illustrating a semiconductor device according to example embodiments.

Referring to FIG. 18, a semiconductor device 1000 may include a core circuit 1100, a voltage regulator 1200, an interface circuit 1300, voltage pads VPD1 and VPD2 and a plurality of pads PD1~PD3.

The core circuit 1100 may be variously configured according to a function of the semiconductor device 1000. The core circuit 1100 may operate based on a core power supply voltage VDDC provided through the voltage pad VPD1, and the interface circuit 1300 may operate based on an output power supply voltage VDDO provided through the voltage pad VPD2. The output power supply voltage VDDO may be higher than the core power supply voltage VDDC.

The voltage regulator 1200 may generate the pull-up reference voltage VREFP and the pull-down reference voltage VREFN as described above based on the output power supply voltage VDDO.

The interface circuit 1300 may include a plurality of output buffer circuits OBF1~OBF3 configured to output a plurality of output signals SOUT1~SOUT3 through the plurality of pads PD1~PD3. The plurality of output buffer circuits OBF1~OBF3 may have the same structure to provide multiple parallel bits.

Each of the output buffer circuits OBF1~OBF3 may include a level shifting circuit and an output driver consistent with those described above. The output driver may include a pull-up driver, a pull-down driver and a reference voltage compensation circuit. The pull-up driver may be connected between the output power supply voltage VDDO and each output node to pull up the voltage at each output node based on the pull-up driving signal and the pull-up reference voltage VREFP. The pull-down driver may be connected between each output node and the ground voltage VSS to pull down the voltage at each output node based on the pull-down driving signal and the pull-down reference voltage VREFN. As described above, the reference voltage compensation circuit may perform the short operation during transitions of the pull-up driving signal and the pull-down driving signal. For example, the reference voltage compensation circuit may electrically connect at least one of the pull-up reference voltage VREFP and the pull-down reference voltage VREFN to at least one of the output power supply voltage VDDO and the ground voltage VSS.

Additionally, the interface circuit 1300 may further include a plurality of input buffer circuits configured to receive signals from an external device so that the semiconductor device 1000 may perform bi-directional communication.

FIGS. 19 through 22 are diagrams for describing improvement of a slew rate by a semiconductor device according to example embodiments.

Figure 19:
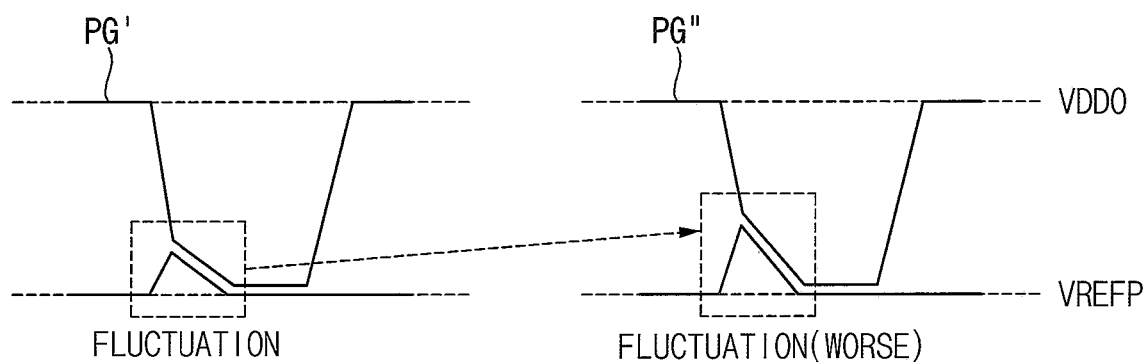
FIGS. 19 through 22 are diagrams for describing improvement of a slew rate by a semiconductor device according to example embodiments.
Figure 20:
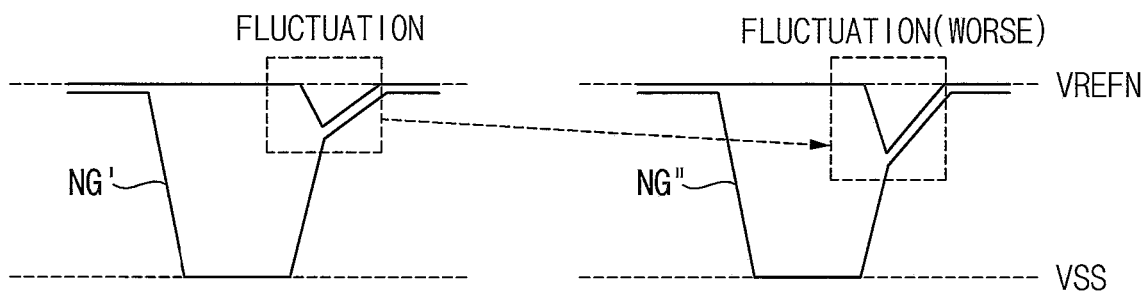

A pull-up driving signal PG', a pull-down driving signal NG', the pull-up reference voltage VREFP and the pull-down reference voltage VREFN when a relatively small number of output buffer circuits operate simultaneously are illustrated in the left portions of FIGS. 19 and 20. A pull-up driving signal PG", a pull-down driving signal NG", the pull-up reference voltage VREFP and the pull-down reference voltage VREFN when a relatively large number of output buffer circuits operate simultaneously are illustrated in the right portions of FIGS. 19 and 20, As illustrated in FIGS. 19 and 20, the large number of the output buffer circuits may cause more fluctuation than the small number of the output buffer circuits because the operation current increases as the number of output buffer circuits operating simultaneously increases.

Figure 21:
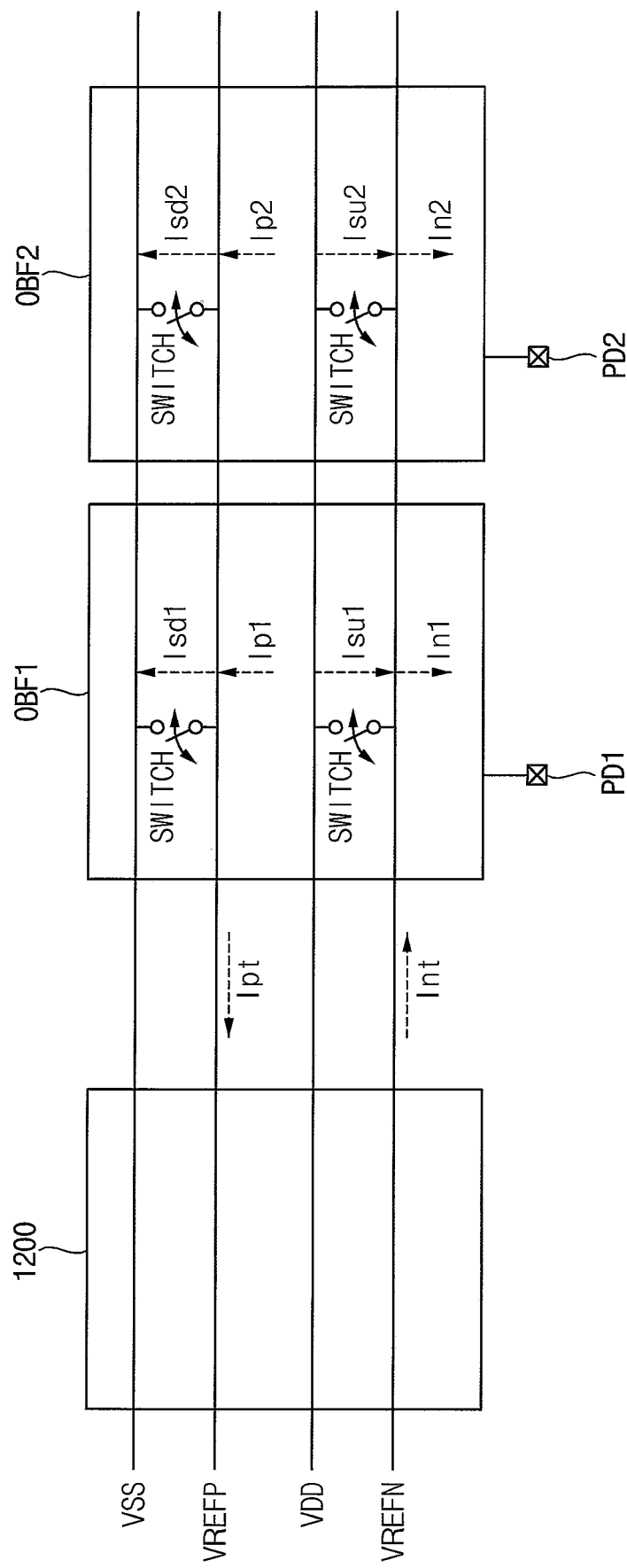

FIG. 21 illustrates a plurality of output buffer circuits OBF1 and OBF2, which are included in the same power domain as a voltage regulator 1200 generating the pull-up reference voltage VREFP and the pull-down reference voltage VREFN based on the output power supply voltage VDDO and the ground voltage VSS. For convenience of illustration and description, only the two output buffer circuits OBF1 and OBF2 are illustrated in FIG. 21. However, example embodiments are not limited thereto.

When the short operation is not performed, an entire pull-up operation current Pit becomes Ip1+Ip2 corresponding to a sum of respective pull-up currents Ip1 and Ip2, and an entire pull-down operation currents Int becomes In1+In2 corresponding to a sum of respective pull-down currents In1 and In2.

In contrast, when short operation according to example embodiments is performed, the entire pull-up operation current Ipt may be reduced to (Ip1+Ip2)−(Isd1+Isd2) and the entire pull-down operation current Int may be reduced to (In1+In2)−(Isu1+Isu2), using the pull-down short currents Isd1 and Isd2 and the pull-up short currents Isu1 and Isu2.

As such, the fluctuation of the reference voltages may be reduced through the short operation to stabilize the reference voltages and the slew rate or the transition delay of the output signal may be improved.

Figure 22:
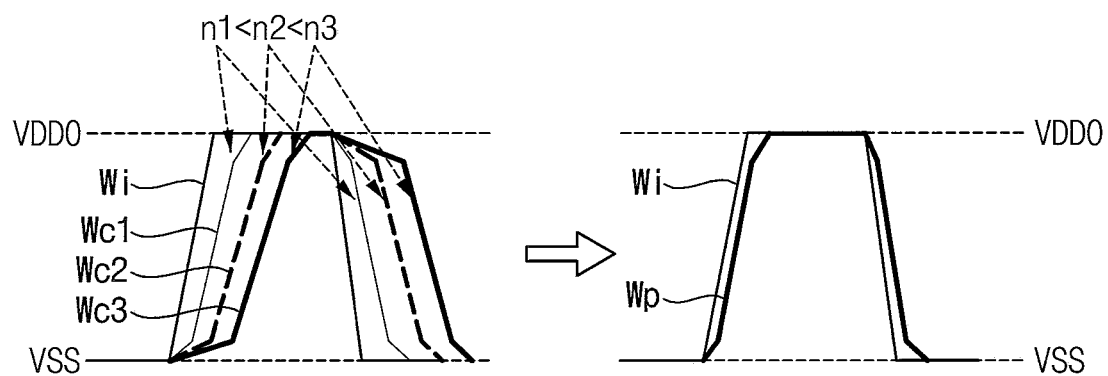

FIG. 22 is a diagram illustrating improvement of a slew rate by an output driver according to example embodiments.

In FIG. 22, Wi indicates a waveform of the output signal SOUT in an ideal case in which there is no voltage fluctuation, Wp indicates a waveform of the output signal SOUT when a short operation according to example embodiments is performed, and Wc1, Wc2 and Wc3 indicate waveforms of the output signal SOUT when the short operation is not performed.

Wc1 indicates a case of n1 output buffer circuits operating simultaneously, Wc2 indicates a case of n2 output buffer circuits operating simultaneously, and Wc3 indicates a case of n3 output buffer circuits operating simultaneously, where n1, n2 and n3 are positive integers, n2 is larger than n1, and n3 is larger than n2. As illustrated in FIG. 22, the transition time is increased and the slew rate is decreased as the number of the output buffer circuits operating simultaneously increases.

In contrast, in the case Wp when the short operation is performed according to example embodiments, the slew rate may be improved and the performance may be minimally affected by the number of the output buffer circuits operating simultaneously.

Figure 23:
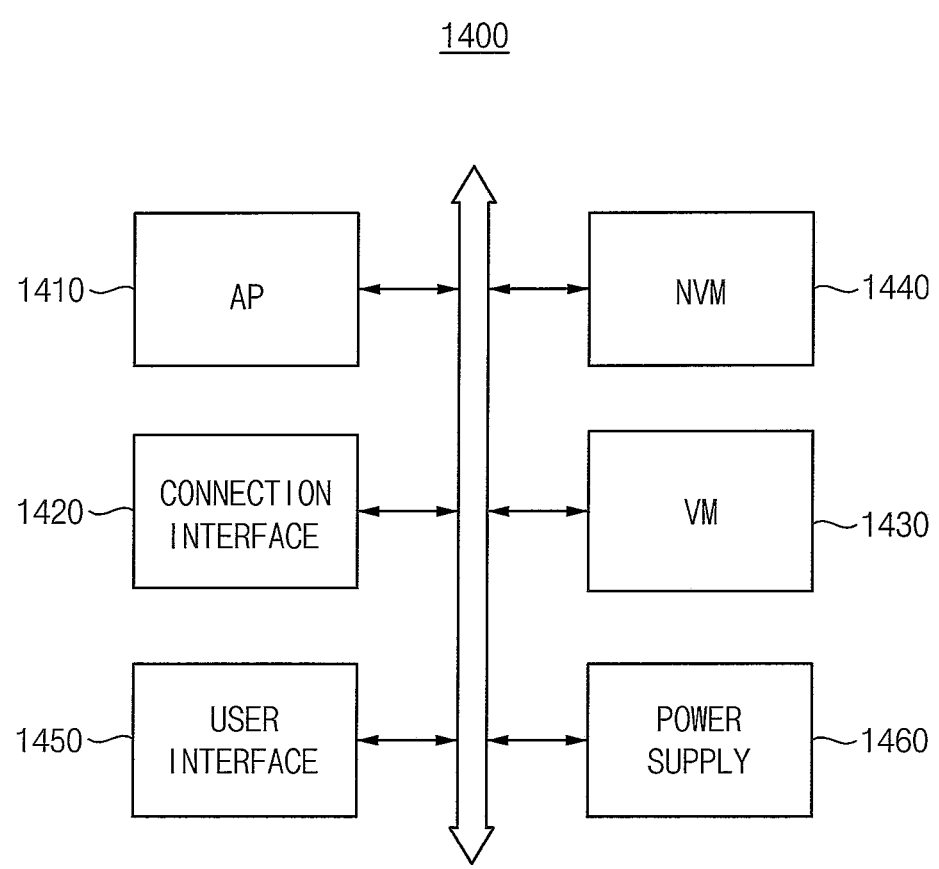
FIG. 23 is a block diagram illustrating a system according to example embodiments.

FIG. 23 is a block diagram illustrating a system according to example embodiments.

Referring to FIG. 23, a system 1400 includes an application processor (AP) 1410, a connection interface 1420, a volatile memory device (VM) 1430, a nonvolatile memory device (NVM) 1440, a user interface 1450, and a power supply 1460. In some example embodiments, the system 1400 may be, for example, a mobile phone, a smart phone, a personal digital assistant (PDA), a portable multimedia player (PMP), a digital camera, a music player, a portable game console, a navigation system, or another type of electronic device.

The application processor 1410 may execute applications, e.g., a web browser, a game application, a video player, etc. The connection interface 1420 may perform wired or wireless communication with an external device. The volatile memory device 1430 may store data processed by the application processor 1410 or may operate as a working memory. The nonvolatile memory device 1440 may store a boot image for booting the system 1400. The user interface 1450 may include at least one input device, such as a keypad, a touch screen, etc., and at least one output device, such as a speaker, a display device, etc. The power supply 1460 may supply a power supply voltage to the system 1400.

According to example embodiments, at least one of an application processor 1410, a connection interface 1420, a volatile memory device 1430, a nonvolatile memory device 1440, a user interface 1450, and a power supply 1460 may include at least one output buffer circuit performing the short operation as described above. The output buffer circuit may include an output driver and the output driver may include a reference voltage compensation circuit. As described above, the reference voltage compensation circuit may perform the short operation during transitions of the pull-up driving signal and the pull-down driving signal such that at least one of the pull-up reference voltage and the pull-down reference voltage is electrically connected to at least one of the output power supply voltage and the ground voltage.

As described above, the output driver and the output buffer circuit according to example embodiments may realize high voltage input-output without high voltage components. In addition, the output driver and the output buffer circuit according to example embodiments may stabilize the reference voltage and improve a slew rate or a transition delay of the output signal by compensating for fluctuation of the reference voltage through the short operation.

Example embodiments herein may be applied to any device and system communicating with other devices and systems. For example, the present inventive concept may be applied to systems such as a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive device, etc.

The foregoing is illustrative of example embodiments and is not to be construed as limiting thereof. While aspects of example embodiments have been particularly shown and described, it will be understood that various changes in form and details may be made therein without departing from the spirit and scope of the following claims.

What is claimed is:

1. An output driver comprising:
   a pull-up driver connected between an output power supply voltage and an output node, and configured to pull up a voltage at the output node based on a pull-up driving signal and a pull-up reference voltage, wherein the pull-up reference voltage is generated by a voltage regulator which operates based on the output power supply voltage and a ground voltage;
   a pull-down driver connected between the output node and the ground voltage, and configured to pull down the voltage at the output node based on a pull-down driving signal and a pull-down reference voltage, wherein the pull-down reference voltage is generated by the voltage regulator; and
   a reference voltage compensation circuit configured to perform a short operation during transitions of the pull-up driving signal and the pull-down driving signal, wherein the short operation comprises electrically connecting any one or any combination of the pull-up reference voltage to the ground voltage, and the pull-down reference voltage to the output power supply voltage.

2. The output driver of claim 1, wherein the reference voltage compensation circuit is further configured to electrically connect the pull-up reference voltage and the ground voltage at rising edges of the pull-down driving signal.

3. The output driver of claim 1, wherein the reference voltage compensation circuit is further configured to electrically connect the pull-down reference voltage and the output power supply voltage at falling edges of the pull-up driving signal.

4. The output driver of claim 1, wherein the reference voltage compensation circuit is further configured to generate a pull-down short current at falling edges of the pull-down driving signal and a pull-up short current at rising edges of the pull-up driving signal.

5. The output driver of claim 1, wherein the reference voltage compensation circuit is further configured to control a short current which flows during the short operation based on an output impedance of the output driver.

6. The output driver of claim 1, wherein the reference voltage compensation circuit comprises:
   a pulse generation circuit configured to generate a pulse signal based on edges of the pull-up driving signal and the pull-down driving signal; and
   a switch circuit configured to perform the short operation based on the pulse signal.

7. The output driver of claim 6, wherein the pulse generation circuit comprises:
   a pull-up pulse generation circuit configured to generate a pull-up pulse signal based on rising edges of the pull-up driving signal; and
   a pull-down pulse generation circuit configured to generate a pull-down pulse signal based on falling edges of the pull-down pulse signal.

8. The output driver of claim 7, wherein the switch circuit comprises:
   a pull-up switch circuit configured to electrically connect the pull-down reference voltage and the output power supply voltage based on the pull-up pulse signal; and
   a pull-down switch circuit configured to electrically connect the pull-up reference voltage and the ground voltage based on the pull-down pulse signal.

9. The output driver of claim 8, wherein the pull-up switch circuit comprises at least one P-type transistor connected between the pull-down reference voltage and the output power supply voltage, and
   wherein the pull-down switch circuit comprises at least one N-type transistor connected between the pull-up reference voltage and the ground voltage.

10. The output driver of claim 1, wherein the reference voltage compensation circuit comprises a plurality of transistors connected in parallel between the pull-up reference voltage and the ground voltage or between the pull-down reference voltage and the output power supply voltage.

11. The output driver of claim 10, wherein the reference voltage compensation circuit further comprises a short current control circuit configured to control, based on an output impedance of the output driver, a number of transistors that are turned on, among the plurality of transistors, during the short operation.

12. The output driver of claim 1, wherein the pull-up driver comprises a pull-up driving transistor and a pull-up bias transistor connected by a cascode structure between the output power supply voltage and the output node, wherein a gate electrode of the pull-up driving transistor is configured to receive the pull-up driving signal, and a gate electrode of the pull-up bias transistor is configured to receive the pull-up reference voltage, and
   wherein the pull-down driver comprises a pull-down driving transistor and a pull-down bias transistor connected by a cascode structure between the output node and the ground voltage, wherein a gate electrode of the pull-down driving transistor is configured to receive the pull-down driving signal, and a gate electrode of the pull-down bias transistor is configured to receive the pull-down reference voltage.

13. The output driver of claim 12, wherein the pull-up driver further comprises a pull-up control transistor connected by a cascode structure with the pull-up driving transistor and the pull-up bias transistor between the output power supply voltage and the output node, wherein a gate electrode of the pull-up control transistor is configured to receive a pull-up control signal, and wherein the pull-down driver further comprises a pull-down control transistor connected by a cascode structure with the pull-down driving transistor and the pull-down bias transistor between the output node and the ground voltage, wherein a gate electrode of the pull-down control transistor is configured to receive a pull-down control signal.

14. The output driver of claim 13, further comprising:
a dynamic control circuit configured to generate the pull-up control signal and the pull-down control signal based on transitions of an output signal at the output node.

15. The output driver of claim 1, wherein an output signal at the output node transitions between the output power supply voltage and the ground voltage.

16. The output driver of claim 15, wherein the pull-up driving signal transitions between the output power supply voltage and the pull-up reference voltage, wherein the pull-down driving signal transitions between the ground voltage and the pull-down reference voltage, wherein the pull-up reference voltage is lower than the output power supply voltage, and wherein the pull-down reference voltage is higher than the ground voltage.

17. An output buffer circuit comprising:
a level shifting circuit configured to generate a pull-up driving signal and a pull-down driving signal based on an input signal; and
an output driver configured to generate an output signal at an output node based on the pull-up driving signal and the pull-down driving signal, wherein the output driver comprises:
  a pull-up driver connected between an output power supply voltage and the output node, and configured to pull up a voltage at the output node based on the pull-up driving signal and a pull-up reference voltage, wherein the pull-up reference voltage is generated by a voltage regulator which operates based on the output power supply voltage and a ground voltage;
  a pull-down driver connected between the output node and the ground voltage, and configured to pull down the voltage at the output node based on the pull-down driving signal and a pull-down reference voltage, wherein the pull-down reference voltage is generated by the voltage regulator; and
  a reference voltage compensation circuit configured to perform a short operation during transitions of the pull-up driving signal and the pull-down driving signal, wherein the short operation comprises electrically connecting any one or any combination of the pull-up reference voltage to the ground voltage and the pull-down reference voltage to the output power supply voltage.

18. The output buffer circuit of claim 17, wherein the level shifting circuit comprises:
a first level shifter configured to generate the pull-down driving signal transitioning between the pull-down reference voltage and the ground voltage based on the input signal; and
a second level shifter configured to generate the pull-up driving signal transitioning between the output power supply voltage and the pull-up reference voltage based on the pull-down driving signal.

19. The output buffer circuit of claim 17, wherein the reference voltage compensation circuit comprises:
a pulse generation circuit configured to generate a pulse signal based on edges of the pull-up driving signal and the pull-down driving signal; and
a switch circuit configured to perform the short operation based on the pulse signal.

20. An output driver comprising:
a pull-up driving transistor and a pull-up bias transistor connected by a cascode structure between an output power supply voltage and an output node, wherein a gate electrode of the pull-up driving transistor is configured to receive a pull-up driving signal, and a gate electrode of the pull-up bias transistor is configured to receive a pull-up reference voltage that is generated by a voltage regulator which operates based on the output power supply voltage and a ground voltage;

a pull-down driving transistor and a pull-down bias transistor connected by a cascode structure between the output node and the ground voltage, wherein a gate electrode of the pull-down driving transistor is configured to receive a pull-down driving signal, and a gate electrode of the pull-down bias transistor is configured to receive a pull-down reference voltage that is generated by the voltage regulator;

a first reference voltage compensation circuit configured to electrically connect the pull-up reference voltage to the ground voltage during transitions of the pull-down driving signal; and a second reference voltage compensation circuit configured to electrically connect the pull-down reference voltage to the output power supply voltage during transitions of the pull-up driving signal.

* * * * *